US009725302B1

(12) United States Patent
Tedeschi et al.

(10) Patent No.: US 9,725,302 B1
(45) Date of Patent: Aug. 8, 2017

(54) WAFER PROCESSING EQUIPMENT HAVING EXPOSABLE SENSING LAYERS

(71) Applicant: Applied Materials, Inc., Santa Clara, CA (US)

(72) Inventors: Leonard Tedeschi, San Jose, CA (US); Lili Ji, Santa Clara, CA (US); Olivier Joubert, Meylan (FR); Dmitry Lubomirsky, Cupertino, CA (US); Philip Allan Kraus, San Jose, CA (US); Daniel T. McCormick, San Francisco, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 15/247,717

(22) Filed: Aug. 25, 2016

(51) Int. Cl.
  *H01L 27/146* (2006.01)
  *B81B 7/00* (2006.01)
  *B81C 1/00* (2006.01)
  *H01L 21/67* (2006.01)

(52) U.S. Cl.
  CPC ........ *B81B 7/0058* (2013.01); *B81C 1/00031* (2013.01); *H01L 21/67288* (2013.01); *B81B 2201/047* (2013.01); *B81C 1/00412* (2013.01)

(58) Field of Classification Search
  CPC . H01L 21/67288; H01L 22/30; B81B 7/0058; B81B 2201/047; B81C 1/00031; B81C 1/00412
  USPC ....................................... 257/443
  See application file for complete search history.

(56) References Cited

U.S. PATENT DOCUMENTS

| 6,614,050 B1* | 9/2003 | Yamada ............ H01L 21/67276 257/48 |
| 6,696,362 B2 | 2/2004 | Rossman et al. |
| 7,159,599 B2* | 1/2007 | Verhaverbeke ... H01L 21/67069 134/109 |
| 7,166,480 B2 | 1/2007 | Shiraishi et al. |
| 7,521,915 B2 | 4/2009 | Herchen et al. |
| 7,567,072 B2 | 7/2009 | Orvek |
| 8,823,933 B2 | 9/2014 | Bonciolini et al. |

OTHER PUBLICATIONS

U.S. Appl. No. 15/068,464, filed Mar. 11, 2016, titled "Wafer Processing Tool Having a Micro Sensor", by inventor Leonard Tedeschi, 66 pages (filing documents, specification and drawings).

(Continued)

*Primary Examiner* — Tu-Tu Ho
(74) *Attorney, Agent, or Firm* — Blakely Sokoloff Taylor & Zafman LLP

(57) ABSTRACT

Embodiments include devices and methods for detecting particles, monitoring etch or deposition rates, or controlling an operation of a wafer fabrication process. In an embodiment, one or more micro sensors are mounted on wafer processing equipment, and are capable of measuring material deposition and removal rates in real-time. The micro sensors are selectively exposed such that a sensing layer of a micro sensor is protected by a mask layer during active operation of another micro sensor, and the protective mask layer may be removed to expose the sensing layer when the other micro sensor reaches an end-of-life. Other embodiments are also described and claimed.

20 Claims, 10 Drawing Sheets

(56) References Cited

OTHER PUBLICATIONS

U.S. Appl. No. 15/009,705, filed Jan. 28, 2016, titled "Real Time Process Characterization", by inventors Leonard Tedeschi and Kartik Ramaswamy, 76 pages (filing documents, specification and drawings).
Harash Ajjam, "Individual Air-Borne Particle Mass Measurement Using High-Frequency Micromechanical Resonators", IEEE Sensors Journal, vol. 11, No. 11, Nov. 2011, pp. 2883-2890.

* cited by examiner

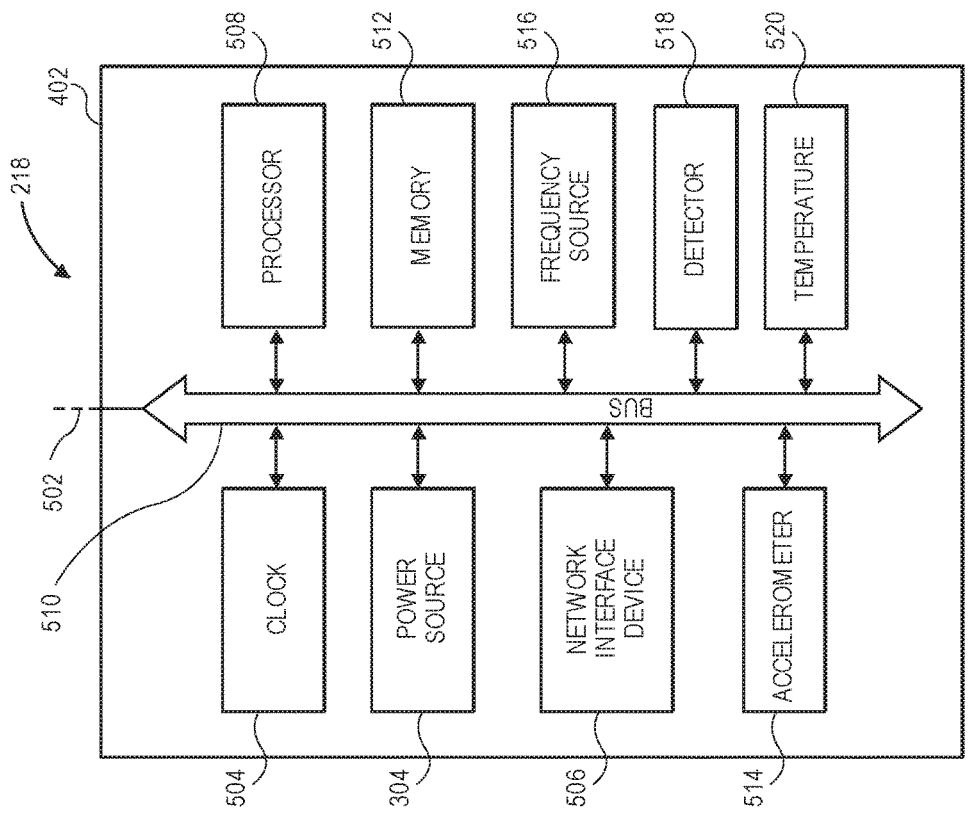
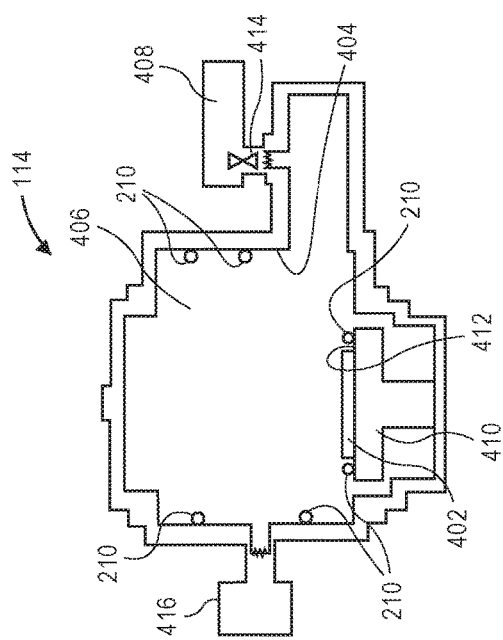
FIG. 5
FIG. 4

WAFER PROCESSING EQUIPMENT HAVING EXPOSABLE SENSING LAYERS

BACKGROUND

1) Field

Embodiments relate to the field of semiconductor processing and, in particular, to devices and methods for measuring material deposition or material removal in a wafer processing tool.

2) Description of Related Art

A primary concern in the manufacture of semiconductor devices is particle contamination of a semiconductor wafer. Such contamination typically occurs during one or more operations performed by a wafer processing tool during manufacture of the semiconductor devices. For example, the wafer processing tool may include several interfaces, e.g., several chambers interconnected by load locks, and the actuation or operation of any of these system components may generate metallic or nonmetallic particles such as aluminum, stainless steel, zirconium, or other particles that can contaminate a semiconductor wafer in the tool. One skilled in the art will appreciate that particles may come from many sources within the wafer processing tool other than interfaces and moving parts, and thus, the above is provided by way of example.

To identify a source and/or root cause of particle contamination, semiconductor wafers are periodically processed through one or more chambers of the wafer processing tool and then subjected to a particle inspection operation. The particle inspection operation requires the processed wafer to be queued for inspection by optical inspection equipment to identify a location and general size of particles, and then queued for inspection by scanning electron microscopy, energy dispersive spectroscopy, or other inspection techniques to determine a presence and/or composition of particles on the wafer. After detecting the presence and composition of the particles, additional troubleshooting may be required to identify which of the operations performed by the wafer processing tool actually led to the particle contamination.

The manufacture of semiconductor devices may involve the deposition and removal of material, and more particularly semiconductor material, on a substrate by the wafer processing tool using, e.g., deposition or etching processes. To accurately deposit or remove a specified amount of semiconductor material, film thickness measurement techniques may be used. For example, material deposition and material removal rates may be indirectly measured by processing a wafer of semiconductor material for a given amount of time, and then measuring an amount of film deposited or removed using an ellipsometer. Furthermore, sensors have been used to measure secondary factors that correlate with deposition/removal rates to indirectly estimate deposition/removal rates during a wafer fabrication process.

SUMMARY

Embodiments include wafer processing equipment having micro sensors, e.g., sensors sized on a MEMS-scale and/or fabricated using MEMS processes, to detect an amount or rate of material deposition or removal. In an embodiment, the wafer processing equipment includes a particle monitoring device having micro sensors to detect particles within a wafer processing tool, or a wafer processing tool having micro sensors to monitor or control a wafer fabrication process. The micro sensors of the wafer processing equipment may include sensing layers and mask layers configured such that the sensing layers may be selectively protected or exposed. Accordingly, a sensing layer of a micro sensor may be protected by a mask layer while another micro sensor is exposed to actively sense particles and/or material deposition or removal. The mask layer may be removed to expose the sensing layer when the other micro sensor reaches an end-of-life. As such, the micro sensors of the wafer processing equipment may be refreshed without interrupting a wafer fabrication process, e.g., opening a chamber or process station of a wafer processing tool.

In an embodiment, wafer processing equipment, e.g., a wafer processing tool or a particle monitoring device, includes a first micro sensor and a second micro sensor. For example, the micro sensors may be mounted within a chamber volume of a process chamber of the wafer processing tool, or may be mounted on a support surface of a wafer substrate of the particle monitoring device. Each of the micro sensors may include a sensing layer covered by a mask layer. More particularly, the sensing layers may be protected by the mask layer during a phase of a wafer fabrication process when a different sensing layer of a same or different micro sensor is monitoring the process. That is, an exposed sensing layer of the active micro sensor may be open to a surrounding environment and/or chamber volume to monitor the wafer fabrication process. The sensors may have respective parameters, e.g., capacitance, and the parameters may change when material is removed from sensors surfaces of the sensing layers. Thus, when material is removed from the exposed sensing layer, a corresponding change in the parameter may be detected to sense an etching process, e.g., particle deposition or removal amounts or rates.

In an embodiment, the micro sensors include mask layers having different thicknesses. For example, a blanket mask layer may cover the sensing layers of several micro sensors, and the blanket mask layer may have a layer profile that includes a variable thickness. Thus, removal of the mask layer may cause a first sensing layer to be exposed before a second sensing layer, allowing the sensing layers to be independently and selectively exposed for sensing at different times in the wafer fabrication process.

In an embodiment, the micro sensors include mask layers having different materials that are susceptible to etching by different etchants. That is, a first mask layer covering a first sensing layer may be dissimilar from a second mask layer covering a second sensing layer. For example, the first mask layer may include an oxide and the second mask layer may include a nitride. Thus, an etchant that attacks oxides may be used to remove the first mask layer and expose the first sensing layer, and an etchant that attacks nitrides may be applied to remove the second mask layer and expose the second sensing layer. Thus, removal of the first mask layer may cause the first sensing layer to be exposed at a different time than the second sensing layer, allowing the sensing layers to be independently and selectively exposed for sensing at different times in the wafer fabrication process.

The above summary does not include an exhaustive list of all aspects. It is contemplated that all systems and methods are included that can be practiced from all suitable combinations of the various aspects summarized above, as well as those disclosed in the Detailed Description below and particularly pointed out in the claims filed with the application.

Such combinations have particular advantages not specifically recited in the above summary.

BRIEF DESCRIPTION OF THE DRAWINGS

FIG. 4 is a sectional illustration of several micro sensors mounted on a wafer processing tool, in accordance with an embodiment.

FIG. 5 is an illustration of a block diagram of electronic circuitry of a particle monitoring device or a wafer processing tool, in accordance with an embodiment.

DETAILED DESCRIPTION

Figure 1:
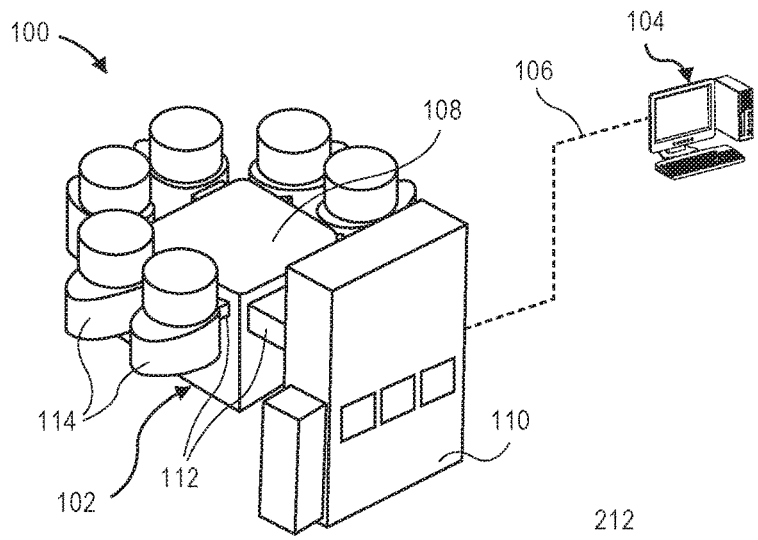
FIG. 1 is an illustration of a wafer processing system, in accordance with an embodiment.

Devices and methods used for particle detection, etch/deposition rate monitoring, or other manufacturing or control of a wafer fabrication process, are described in accordance with various embodiments. In the following description, numerous specific details are set forth in order to provide a thorough understanding of embodiments. It will be apparent to one skilled in the art that embodiments may be practiced without these specific details. In other instances, well-known aspects are not described in detail in order to not unnecessarily obscure embodiments. Furthermore, it is to be understood that the various embodiments shown in the accompanying drawings are illustrative representations and are not necessarily drawn to scale.

Existing techniques for measuring material deposition and removal either do not provide real-time measurement and control of a wafer fabrication process, or provide an estimate of material deposition/removal based on correlation to a secondary factor rather than measuring the deposition/removal directly. For example, an ellipsometer may be used to measure film thickness, however, since the ellipsometer is a periodic monitor, the ellipsometer cannot detect real-time excursions or drifts in the deposition/removal rate for normal production runs. Furthermore, sensors installed in a process chamber of a wafer processing tool to measure secondary factors, such as RF match positions or gas concentrations in a plasma, do not directly measure the variable of concern (deposition/removal rates) and such measurements become more challenging in chambers that do not have a plasma.

Wafer processing equipment having micro sensors to measure material deposition or material removal in all pressure regimes, e.g., under vacuum conditions, and under plasma-less conditions are described below. For example, a micro sensor mounted on a process chamber may include a sensor surface, and a parameter of the micro sensor, e.g., capacitance, may change when material is deposited on or removed from the sensor surface. Thus, real-time measurement of material deposition or removal amounts or rates, as well as uniformity of such amounts or rates, may be monitored and used to control a wafer fabrication process performed by a wafer processing system.

Micro sensors used for real-time measurement of wafer fabrication processes will change over time. More particularly, by design, the sensor surface may be removed by etching (or grown by deposition) and may become roughened, a surface area of the sensor surface may change, the sensor surface may oxidize, etc. These changes can impact a sensitivity of, and reduce a reliability of, the micro sensor. For example, a micro sensor may lose reliability after a couple dozen wafer processing cycles, requiring that the process chamber be opened to clean or replace the micro sensor. Such refreshing of the micro sensor may, however, interrupt the process flow of a wafer fabrication process, and thus, there is a need to extend the sensing capability of the wafer processing equipment as micro sensors degrade, without stopping the wafer fabrication process.

In an aspect, wafer processing equipment may include micro sensors that are selectively exposable to allow for a different micro sensor to take the place of a degraded micro sensor. For example, each micro sensor may include several layers of sensing layers that are separated by intervening mask layers. Accordingly, after a first sensing layer is degraded, the sensing layer and one or more intervening mask layers may be removed to expose an underlying sensing layer for active operation. Alternatively, several laterally separated sensing layers may be covered by a blanket mask layer having a variable thickness. Accordingly, the blanket mask layer may be etched to sequentially expose the sensing layers based on the thickness of the blanket mask layer overlying the respective sensing layers. For example, as the blanket mask layer is removed, a first sensing layer under a first thickness of material may be exposed followed after some time by a second sensing layer under a second thickness of material greater than the first thickness. Using sensor schemes that allow for selective exposure of fresh sensing layers to replace degraded sensing layers, a longevity of the wafer processing equipment, and more particularly, a number of wafer processing cycles of a wafer fabrication process achievable before it becomes necessary to open the process chamber for sensor maintenance, may be increased.

It will be understood that the wafer processing systems and methods described below could be used in any form factor or process where materials are deposited or removed from a substrate. More particularly, although the wafer processing systems and methods are described with respect to wafer processing for the fabrication of integrated circuits, the devices and methods may also be adapted for use in other technologies, such as displays in the electronics industry and/or photovoltaic cells in the solar industry.

Referring to FIG. 1, an illustration of a wafer processing system is illustrated in accordance with an embodiment. A wafer processing system 100 may include a wafer processing tool 102 communicatively coupled to a computer system 104 by a communication link 106. Communication link 106 may be a wired or wireless connection, i.e., wafer processing tool 102 may communicate directly or wirelessly with computer system 104. It will be appreciated that although data may be transferred from wafer processing tool 102 and/or a device within wafer processing tool 102 by communication link 106, in some embodiments, the device within wafer processing tool 102 may be a passive device. That is, the device may be processed by wafer processing tool 102, and may undergo a change, and the change may be measured after the device is taken out of wafer processing tool 102. This may be a feature of, for example, of a particle detection tool or an etch/deposition monitoring tool, as described below.

Wafer processing tool 102 may include a buffer chamber 108 physically connected to a factory interface 110 by one or more load locks 112. Furthermore, one or more process chambers 114 may be physically connected to buffer chamber 108 by one or more respective load locks 112. Buffer chamber 108 may act as an intermediate volume, larger than respective volumes of process chambers 114, that remains at a low pressure, albeit at a pressure higher than the process pressures within process chambers 114. Thus, a semiconductor wafer, e.g., a silicon wafer, may be moved between chambers of wafer processing tool 102 under vacuum conditions during the manufacture of semiconductor devices. Such movement may be enabled by various devices included in the wafer processing tool 102, e.g., robots, robotic arms, shuttles, etc.

Various manufacturing operations may be performed in process chambers 114. For example, at least one process chamber 114 may be an etch chamber, a deposition chamber, a chamber of a semiconductor lithography tool, or any other semiconductor process chamber. As such, process chamber 114 may be used to perform wafer fabrication processes under vacuum conditions, atmospheric conditions, or any other pressure regime.

In addition to varying pressure regimes, process chambers 114 may also be used to perform manufacturing processes having different energetic conditions. For example, process chamber 114 may be a radical-driven etch chamber or a deposition chamber that does not include a plasma. That is, process chamber 114 may be plasma-less during a wafer fabrication process. Alternatively, process chamber 114 may be a plasma-based etch or deposition chamber.

During a wafer fabrication process, a semiconductor wafer may be transferred from buffer chamber 108 into one of the process chambers 114 through load lock 112. Process chambers 114 may have a chamber pressure that is lowered, e.g., using a vacuum pump and/or turbo pump (FIG. 4), to a vacuum condition. In the context of this description, a vacuum condition may be any pressure less than 0.5 atm. In an embodiment, the vacuum condition in process chamber 114 exists when process chamber 114 has a chamber pressure less than the pressure of buffer chamber 108, e.g., less than 100 millitorr. Accordingly, a manufacturing operation performed in process chamber 114 may be carried out under vacuum conditions.

One or more particles may be generated during the manufacturing operation performed in process chamber 114. For example, a particle may be a metallic or nonmetallic particle that is emitted into process chamber 114 when a specific operation occurs, e.g., when a valve of load lock 112 is opened, when a load lock door is locked, when lift pins are moving, or when any other tool operation occurs. The emitted particles may land on the semiconductor wafer, and a landing location and time of particle may correspond to a source of the particle contamination. For example, a particle may land on a semiconductor wafer nearer to load lock 112 and at a time when load lock 112 is closed, indicating that a component of load lock 112 and/or the actuation of load lock 112 is the source of the particle. Thus, it can be seen that particle monitoring that provides information about a location and a time when the particle lands on the semiconductor wafer may be useful in determining a source of particle contamination.

Figure 2:
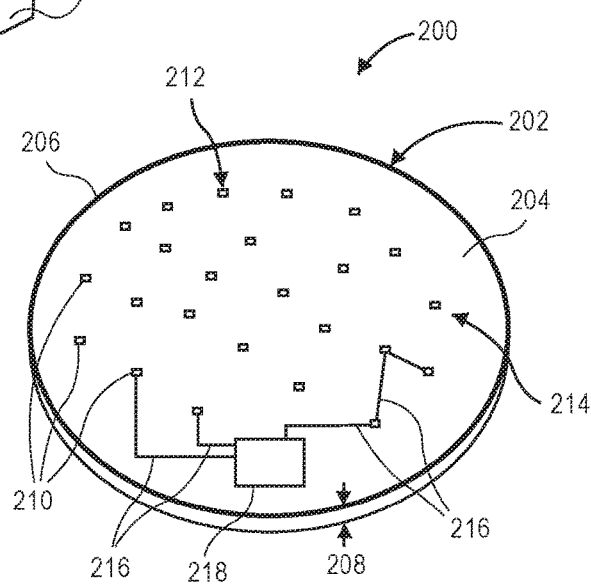
FIG. 2 is an illustration of a particle monitoring device, in accordance with an embodiment.

Referring to FIG. 2, an illustration of a particle monitoring device is illustrated in accordance with an embodiment. Particle monitoring device 200 may be configured to be moved between chambers, e.g., buffer chamber 108 and/or process chambers 114, of wafer processing tool 102. For example, particle monitoring device 200 may include a wafer substrate 202 having an overall form factor and/or a same material and shape as a semiconductor wafer. That is, wafer substrate 202 may be at least partially composed of a semiconductor material, e.g., a crystalline silicon material. Furthermore, wafer substrate 202 may have a wafer form factor that is essentially disc-shaped and includes a support surface 204 having a diameter 206. Support surface 204 may be an upper surface of the disc, and a bottom surface of wafer substrate 202 (not shown) may be spaced apart from support surface 204 by a thickness 208. In an embodiment, the wafer form factor of wafer substrate 202 includes diameter 206 between 95 to 455 mm, e.g., diameter 206 may nominally be 100 mm, 300 mm, or 450 mm. Furthermore, the wafer form factor of wafer substrate 202 may include thickness 208 less than 1 mm, e.g., 525 µm, 775 µm, or 925 µm. Thickness 208 may also be greater than 1 mm, e.g., several millimeters up to 10 mm. Accordingly, particle monitoring device 200 may be manufactured using readily available wafer materials and typical wafer manufacturing processes and equipment, and may essentially simulate a semiconductor wafer when processed by wafer processing tool 102.

Particle monitoring device 200 may include several micro sensors mounted on support surface 204 at predetermined locations. The micro sensors may be one or more of the micro sensor types described below. For example, micro sensors 210 may include respective sensing layers covered by corresponding mask layers. Micro sensors 210 may include respective parameters and include respective sensor surfaces on the respective sensing layers. Accordingly, the respective parameters may change when material is deposited on or removed from the respective sensor surfaces. Numerous micro sensors 210, e.g., thousands to millions of micro sensors, may be mounted on support surface 204. Each micro sensor 210 may have a known location. For example, a first micro sensor 212 may be located at a first location, and a second micro sensor 214 may be located at a second location. The second location may have a known position relative to the first location, or relative to some other reference point on particle monitoring device 200.

Micro sensors 210 may be distributed across support surface 204 randomly, or may be arranged in a predetermined pattern. For example, micro sensors 210 shown in FIG. 2 appear to be randomly distributed across support surface 204, even though their absolute or relative locations may be predetermined and known. In an embodiment, micro sensors 210 are arranged in a predetermined pattern, e.g., a grid pattern, a concentric circle pattern, a spiral pattern, etc. Such patterns may be achieved using known etching processes to build micro sensors 210 at precise locations on support surface 204 of particle monitoring device 200.

In an embodiment, micro sensors 210 are spread over a majority of a surface area of support surface 204. For example, an outer profile drawn through the outermost micro sensors 210 of the micro sensor array may delineate an array area that is at least half of the surface area of support surface 204. In an embodiment, the array area is at least 75% of the surface area, e.g., greater than 90% of the surface area of support surface 204.

The micro sensors 210 of particle monitoring device 200 may be interconnected with each other or other circuitry through one or more electrical connector. For example, micro sensors 210 may be connected in series by an electrical trace 216 running over support surface 204. Alternatively or in addition, several micro sensors 210 may be electrically connected in parallel by respective electrical traces 216. Thus, electrical connections may be made between micro sensors 210, or micro sensors 210 may be connected to wafer electronics, i.e., electronic circuitry 218, using electrical traces, electrical leads, vias, and other known types of electrical connectors.

Each micro sensor 210 of particle monitoring device 200 may be configured to sense a change in a given parameter when a particle interacts with the sensor. For example, a micro sensor 210 may include a capacitive micro sensor as described below, and may have a capacitance that changes when material is deposited on or removed from a sensor surface the micro sensor 210. Thus, the capacitance may change when the micro sensor 210 receives the particle within a chamber, e.g., process chamber 114, of wafer processing tool 102. Here, the term "receives" indicates an interaction between particle and micro sensor 210 that affects the capacitance. It will be appreciated that particle monitoring device 200 may include other micro sensor types, as described below, and thus a different parameter may be sensed when a particle is received by such micro sensors. For example, the parameter may be a voltage, a current, or another physical or electrical characteristic of a micro sensor that changes when the particle lands on the micro sensor, passes near or through the micro sensor, or impacts the micro sensor, as described below. Other particle-sensor interactions will be understood by a skilled artisan when reading this description.

Figure 3:
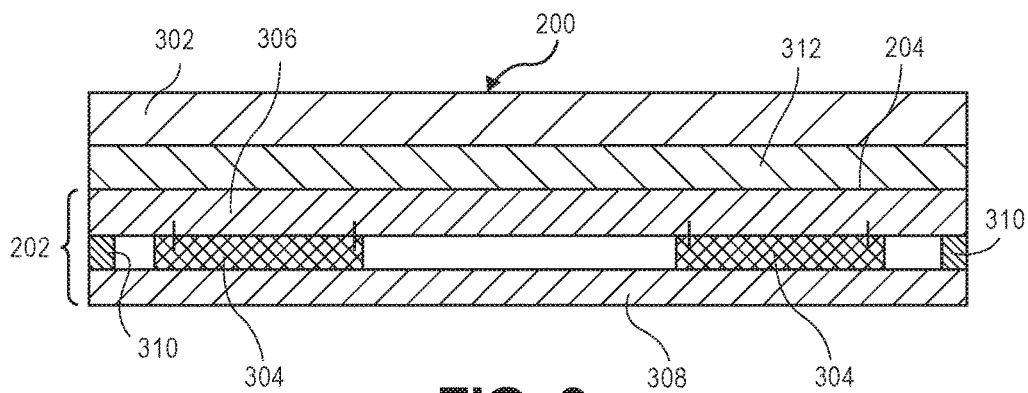
FIG. 3 is a sectional illustration of a particle monitoring device, in accordance with an embodiment.

Referring to FIG. 3, a sectional illustration of a particle monitoring device is illustrated in accordance with an embodiment. Micro sensors 210 may be packaged on wafer substrate 202 that can be automatically loaded into and moved throughout the system, similar to loading and processing of a typical semiconductor wafer. Accordingly, micro sensors 210 can experience the same environment as production semiconductor wafers. In an embodiment, a sensor layer 302 having several micro sensors 210 covers at least a portion of wafer substrate 202. Thus, micro sensors 210 of sensor layer 302 are mounted on support surface 204 of wafer substrate 202.

Sensor layer 302 is not to be confused with a sensing layer, as described below. More particularly, sensor layer 302 may be a layer of wafer processing equipment in which one or more micro sensor 210 is disposed, whereas a sensing layer may be one of several layers of an individual micro sensor 210, which may be exposed to a surrounding environment to detect etch/deposition rate, gas concentration, by-product accumulation, particles, etc.

Any of the portions of particle monitoring device 200 may be built up from a stack of standard, silicon on insulator (SOI) substrates, or other types of wafers. The wafers may be bonded at a wafer level, i.e., bonding of individual wafers having functional components integrally formed. Alternatively, wafers may have individual modules, e.g., chips, sensors, etc., bonded before or after building up the particle monitoring device 200. It will be appreciated that such processes can allow the use of SOI technology to optimize etch sensors, high temperature electronics, or other modules/components that are to be integrated into particle monitoring device 200. It will be appreciated that such processes may also be used to manufacture portions of wafer processing equipment described below, e.g., micro sensors 210 in wafer fabrication processing equipment.

In an embodiment, wafer substrate 202 is structured to protect electronic circuitry 218 of particle monitoring device 200 from attack by a plasma in wafer processing tool 102. As such, wafer substrate 202 may include electronic circuitry 218, e.g., wafer electronics, sandwiched between a top layer 306 and a bottom layer 308. For example, electronic circuitry 218 may include a power source 304, e.g., a thin-film battery. The thin-film battery may be encapsulated between layers 306, 308 of silicon, and thus, may be protected against plasma attack from a top or bottom by two silicon wafers. Furthermore, power source 304 may be protected against plasma attack from the sides by a barrier seal 310. Barrier seal 310 may be sandwiched between top layer 306 and bottom layer 308 around power source 304. More particularly, barrier seal 310 may extend around a circumference of wafer substrate 202 to form a protective wall surrounding the sides of power source 304. Thus, power source 304 may be encapsulated within wafer substrate 202.

Power source 304 may be electrically connected to one or more components of electronic circuitry 218 in top layer 306 and/or sensor layer 302. For example, electronic circuitry 218, e.g., control electronics such as a processor, a memory, or communication electronics, may be built into top layer 306 of wafer substrate 202. Power source 304 may be connected to electronic circuitry 218 in top layer 306 by electrical connections such as through silicon vias extending through one or more layers of particle monitoring device 200. Similarly, power source 304 and/or electronic circuitry 218 in top layer 306, e.g., the processor, may be electrically connected to micro sensors 210 in sensor layer 302 by electrical traces or electrical vias. Accordingly, power source 304 may be electrically coupled to a processor of electronic circuitry 218, micro sensors 210, or other electronic circuitry 218, to power the electronics.

It will be appreciated that physical, chemical, and electrical protection of some regions of wafer processing tool 200 and/or wafer processing equipment may be provide by bonding electronic circuitry 218 onto wafer substrates at a module or chip level, and then capping the components. For example, batteries, processors, sensors, wireless communication modules, etc. can be bonded and then capped, e.g., by barrier layer 312. Some components, however, may be exposed to the wafer processing environment. For example, micro sensors 210 may be exposed on wafer processing tool 200 or wafer processing equipment as described below to monitor etch and deposition processes.

Micro sensors 210 may be exposed to plasma within wafer processing tool 102, and thus, the sensors may eventually wear out. Sensor schemes for extending a total life of the sensor are described below. Nonetheless, it may be advantageous to package micro sensors 210 such that the micro sensors are recyclable. In an embodiment, packaging of micro sensors 210 includes a barrier layer 312 between micro sensor 210 and an underlying substrate. For example, in the case of particle monitoring device 200, barrier layer 312 may be disposed between micro sensor 210 and support surface 204 of wafer substrate 202. Micro sensor 210 may be electrically connected to wafer electronics, i.e., electronic circuitry 218, through barrier layer 312 using known interconnect technology such as through silicon vias. Barrier layer 312 between the control electronics and the sensors may protect the electronics during recycling. For example, micro sensor 210 may be removable by stripping agents, i.e., by a plasma, gaseous or a liquid etchant, and barrier layer 312 may not be strippable by the same stripping agent. That is, barrier layer 312 may be any material, conductive or insulating, that is impervious to a stripping agent, such as a gas phase or liquid etchant. Accordingly, once micro sensors 210 reach an end of their useful life, the plasma may be applied to strip the micro sensors of sensor layer 302 away from barrier layer 312 without degrading electronic circuitry 218 built into wafer substrate 202. Similarly, mechanical stripping may be used to remove the worn-out sensors. A new sensor layer 302 having a new set of micro sensors 210 may then be formed on barrier layer 312 to refurbish particle monitoring device 200 at a lower cost than forming an entirely new particle monitoring device 200.

Components of particle monitoring device 200 may be formed using known semiconductor processes and techniques. For example, as described above, electrical connections between sensors and electronic circuitry 218 may be formed through barrier layer 312 and/or wafer substrate 202 using through silicon vias. Furthermore, components may be built into layers of particle monitoring device 200 using known techniques. For example, micro sensor 210 may be formed separately and then mounted on barrier layer 312 using flip chip technology during the recycling process.

Implementation of micro sensor 210 in particle monitoring device 200 represents an embodiment of using micro sensors 210 for particle detection. Other uses of micro sensors 210 in wafer fabrication processing equipment and methods exist. For example, micro sensors 210 may be mounted on wafer processing tool 102 to detect or measure etch/deposition rate, and such data may be used to control a wafer fabrication process, e.g., and etch or deposition process.

Referring to FIG. 4, a sectional illustration of several micro sensors mounted on a wafer processing tool is illustrated in accordance with an embodiment. A wafer 402, e.g., a wafer of semiconductor material or the wafer substrate 202 of particle monitoring device 200, may be subjected to a wafer fabrication process in process chamber 114 of wafer processing tool 102. Wafer 402 may experience different pressure conditions as the wafer 402 moves through wafer processing tool 102. For example, the semiconductor wafer 402 may be inserted into the factory interface 110 at atmospheric conditions. Then, as the semiconductor wafer 402 goes into a load lock 112 between factory interface 110 and buffer chamber 108, the load lock 112 may be brought to a vacuum condition of 120 millitorr. The semiconductor wafer 402 may then pass from the load lock 112 into buffer chamber 108, having a buffer chamber 108 pressure of 100 millitorr.

Wafer 402 may be transferred from buffer chamber 108 into one of the process chambers 114 through load lock 112. For example, process chamber 114 may include a chamber wall 404 around a chamber volume 406, and chamber volume 406 may be sized to receive wafer 402. Thus, semiconductor material may be deposited on or removed from wafer 402 during a wafer fabrication process within process chamber 114. During the wafer fabrication process, chamber volume 406 of process chamber 114 may have a chamber pressure that is lowered to a vacuum condition using, e.g., a vacuum source 408 such as a vacuum pump and/or turbo pump. In the context of this description, a vacuum condition may be any pressure less than 0.5 atm. In an embodiment, the vacuum condition in process chamber 114 exists when process chamber 114 has a chamber pressure less than the pressure of buffer chamber 108, e.g., less than 100 millitorr. Accordingly, the process chamber 114 may be under vacuum conditions during the manufacturing operation of the wafer fabrication process. Furthermore, the vacuum conditions may reduce or eliminate gaseous mixtures from chamber volume 406, and thus, chamber volume 406 may be plasma-less during the wafer fabrication process.

One or more micro sensors, e.g., micro sensors 210, may be mounted on wafer processing tool 102. The micro sensors may be one or more of the micro sensor types described below. For example, micro sensors 210 may include respective sensing layers covered by corresponding mask layers. Micro sensors 210 may be mounted at one or more locations on process chamber 114 within chamber volume 406. More particularly, several micro sensors 210 may be mounted at predetermined locations on chamber wall 404 within chamber volume 406.

In an embodiment, micro sensor(s) 210 are mounted on portions of wafer processing tool 102 other than chamber wall 404. For example, instead of or in addition to having micro sensors 210 mounted on chamber wall 404, one or more micro sensors 210 may be mounted on a wafer holder 410 within process chamber 114. Wafer holder 410 may be, for example, an electrostatic chuck having electrode(s) to electrostatically clamp wafer 402 during a wafer fabrication process. Wafer holder 410 may include a holding surface 412 upon which wafer 402 is clamped. For example, holding surface 412 may be a layer of dielectric material over wafer holder 410, and micro sensor 210 may be mounted on holding surface 412. More particularly, micro sensors 210 may be mounted on holding surface 412 in a region near and/or laterally offset from wafer 402 during the wafer fabrication process. For example, a process kit may include a ring around wafer 402 on holding surface 412, and micro sensor 210 may be mounted on process kit.

It is contemplated that micro sensors 210 may be located in process chamber 114 or built into consumable or non-consumable parts of process chamber 114, e.g., wafer holder 410, within close enough proximity to wafer 402 to detect changes in material deposition or removal rates of wafer 402. For example, wafer 402 may have a forward-facing surface, i.e., a surface facing away from holding surface 412 toward a plasma, and micro sensor 210 may be mounted on holding surface 412 such that a sensor surface sensitive to material deposition/removal is also facing forward.

It will be appreciated that micro sensors 210 may be mounted at locations on wafer processing tool 102 other than locations within process chamber 114. For example, one or more micro sensors may be mounted on, in, or in proximity to, load lock 112. Similarly, micro sensor 210 may be mounted on, in, or in proximity to a gas line (not shown) of wafer processing tool 102, a pressure control valve 414 of wafer processing tool 102 that controls flow to vacuum source 408, a robot of wafer processing tool 102, or a lift pin of wafer processing tool 102, to name several example locations. Micro sensors 210 may be mounted in proximity to other locations of wafer processing tool 102 depending on the particular process measurement and control that is desired. Here, "in proximity to" is used as a relative term, but it will be appreciated that the presence of micro sensor 210 near a particular component of wafer processing tool 102 is intended to describe a distance such that particles or material deposited on or removed from the component is statistically likely to interact with the mounted sensor. Examples of these interactions are described further with respect to the methods described below.

As used herein, the term "micro" may refer to the descriptive size of certain sensors or structures in accordance with embodiments. For example, the term "micro sensor" may refer to a capacitive sensor having dimensions on the scale of nanometers to 100 μm. That is, in an embodiment, micro sensors 210 as described below may have typical dimensions in the range of 0.05 to 100 μm for individual cells which may be connected in parallel or series. Accordingly, micro sensors 210 as described herein are readily distinguishable from other sensor types, e.g., microbalances, which are instruments capable of making precise measurements of weight on the order of a million parts of a gram. That is, microbalances may measure weight on a microscale, but are not within the same size range of the micro sensors described herein. The difference in size range is advantageous at least because several micro sensors, e.g., thousands, may be fit into chamber volume 406 or elsewhere on wafer processing tool 102, whereas several microbalances may not fit into chamber volume 406 that is sized to receive a semiconductor wafer 402.

As used herein, the term "micro sensors" may also refer to sensors that are fabricated using materials and manufacturing processes pertinent to microelectromechanical systems (MEMS). That is, micro sensors 210 described herein may be fabricated using MEMS processes such as deposition processes, patterning, etching, etc. Accordingly, micro sensors 210 may be MEMS-scale sensors having a size and structure formed using MEMS processes. It is to be appreciated, however, that embodiments are not necessarily so limited, and that certain aspects of the embodiments may be applicable to larger, and possibly smaller size scales.

While as few as one micro sensor may be mounted on wafer processing tool 102, numerous micro sensors, e.g., hundreds to millions of micro sensors, may be fit into chamber volume 406 or mounted elsewhere on wafer processing tool 102. That is, given the MEMS-scale size of micro sensors described below, many micro sensors may be distributed along wafer processing tool 102, e.g., around chamber wall 404 (or other components of wafer processing tool 102), to monitor wafer fabrication process parameters, e.g., a deposition/removal of semiconductor material within process chamber 114, in real-time.

Each micro sensor 210 may have a known location. For example, a first micro sensor may be located at a first predetermined location on wafer processing tool 102, e.g., at a first location within chamber volume 406, and a second micro sensor may be located at a second predetermined location on wafer processing tool 102, e.g., at a second location within chamber volume 406. Micro sensors 210 may be distributed on process chamber 114 randomly or in a predetermined pattern. For example, the second location may have a known position relative to the first location, or relative to some other reference point on process chamber 114. Thus, uniformity of material deposition/removal may be determined as described below, by comparing real-time measurements from the first micro sensor and the second micro sensor.

Wafer processing tool 102 may include other sensors and/or measurement instruments to detect a process parameter of the wafer fabrication process. The other sensors and/or measurement instruments may not be micro sensors. For example, in contrast to MEMS-scale sensors described below, wafer processing tool 102 may include an optical spectrometer 416 mounted on process chamber 114 or otherwise mounted to detect an optical emissions spectrometry (OES) signature of chamber volume 406 during the wafer fabrication process. The OES signature may identify a type and amount of elements within chamber volume 406. For example, the OES signature may identify what chemical elements are present in a plasma within chamber volume 406 during the wafer fabrication process. Other sensors may be used to detect other process parameters of the wafer fabrication process performed in chamber volume 406. Such other sensors may include electrical sensors to measure power delivered to process chamber 114 or wafer 402, electrical sensors to measure electrical characteristics of wafer holder 410, etc. Such sensors may not measure an actual amount or rate of deposition/removal of semiconductor material 1108, but may nonetheless be correlated to actual deposition/removal measurements made by micro sensors 210 for the reasons described below.

Other sensors may also be used to gather information that correlates to a presence of a particle in wafer processing tool 102. For example, one or more measurement devices, e.g., accelerometers (not shown), may be mounted on moving parts of wafer processing tool 102. In an embodiment, a robot or a robotic arm includes an accelerometer to sense motion of the robot. Alternatively, a load lock door includes an accelerometer. Accordingly, a process parameter of a wafer fabrication process, e.g., motion data representative of a robotic movement, may be detected by the accelerometer and may be correlated to particle sensing data gathered from micro sensor 210 to determine a source of particulate. Applications of such other sensors, e.g., accelerometers, are described further below.

Micro sensors 210 and/or measurement instruments or devices of wafer processing tool 102 may be interconnected with each other or other circuitry through one or more electrical connector. For example, micro sensors 210 may be connected in series by an electrical trace running over chamber wall 404 and/or wafer holder 410. Alternatively or in addition, several micro sensors 210 may be electrically connected in parallel by respective electrical traces 216. Thus, electrical connections may be made between micro sensors 210 and/or micro sensors 210 may be connected to electronic circuitry 218, using electrical traces, electrical leads, vias, and other known types of electrical connectors.

Referring to FIG. 5, an illustration of a block diagram of electronic circuitry of a particle monitoring device or a wafer processing tool is illustrated in accordance with an embodiment. Electronic circuitry 218 of particle monitoring device 200 or wafer processing tool 102 may be supported by an underlying structure of a wafer 402 or wafer processing tool 102. For example, electronic circuitry 218 may be mounted on top layer 306 of particle monitoring device 200, as described above. Electronic circuitry 218 may be enclosed in a housing. The housing and/or electronic components of electronic circuitry 218 may be integral to wafer 402, e.g., the housing may be layers of wafer substrate encapsulating electronic circuitry 218. Alternatively, the housing may be mounted on wafer processing tool 102, e.g., on chamber wall 404 or wafer holder 410. Similarly, the housing may be mounted on another portion of wafer processing tool 102, e.g., on an external surface outside of chamber volume 406. Accordingly, electronic circuitry 218 may be co-located or remotely placed relative to micro sensor 210. Electronic circuitry 218 may nonetheless be placed in electrical connection with micro sensor 210 through one or more input/output (I/O) connection 502, e.g., an electrical trace, electrical lead, or via, even when mounted remotely relative to micro sensor 210.

Electronic circuitry 218 of wafer processing equipment may include a clock 504. Clock 504 may be an electronic circuit having an electronic oscillator, e.g., a quartz crystal, to output an electrical signal having a precise frequency, as is known in the art. Thus, clock 504 may be configured to output a time value corresponding to an electrical signal received through I/O connection 502. The time value may be an absolute time value independent of other operations, or the time value may be synchronized to other clocks in the wafer processing equipment. For example, clock 504 may be synchronized to a system clock of wafer processing tool 102, or a system clock of a host computer of a fabrication facility linked to wafer processing tool 102, such that the time value output by clock 504 corresponds to a system time value and/or system operations that are output or controlled by the system clock. Clock 504 may be configured to initiate the output of the time value when a particular process operation occurs. Electronic circuitry 218 of wafer processing equipment may include a network interface device 506 to transmit and receive communications between wafer processing tool 102 and the host computer.

Electronic circuitry 218 of wafer processing equipment may include a processor 508. Processor 508 may be operably coupled, e.g., electrically connected by a bus 510 and/or traces, to clock 504. Processor 508 represents one or more general-purpose processing devices such as a microprocessor, central processing unit, or the like. More particularly, processor 508 may be a complex instruction set computing (CISC) microprocessor, reduced instruction set computing (RISC) microprocessor, very long instruction word (VLIW) microprocessor, a processor implementing other instruction sets, or processors implementing a combination of instruction sets. Processor 508 may also be one or more special-purpose processing devices such as an application specific integrated circuit (ASIC), a field programmable gate array (FPGA), a digital signal processor (DSP), network processor, or the like.

Processor 508 is configured to execute processing logic for performing the operations described herein. For example, processor 508 may be configured to receive and analyze input signals from several micro sensors 210 located at different predetermined locations on particle monitoring device 200 or wafer processing tool 102. Accordingly, processor 508 may determine and record data related to the micro sensors 210 to which it is operably connected. For example, processor 508 may record a location of a micro sensor 210 when the capacitance of micro sensor changes. Processor 508 may also receive time value outputs from clock 504 corresponding to each received input signal and may record the time value output to memory as a time stamp. Accordingly, processor 508 may compare input signals from several micro sensors 210, e.g., to determine a uniformity of a wafer fabrication process at a given time. Processor 508 may be configured to determine other types of information based on signals received from micro sensors 210. For example, input signals received from one or more micro sensors 210 may be used to endpoint the wafer fabrication process or to determine a root cause of a change in the wafer fabrication process, as described below.

Other functionality may be provided by processor 508 as described herein. For example, processor 508 may include signal processing functionality, e.g., may convert analog signals from micro sensor 210 into digital signals. Of course, a dedicated digital-to-analog converter may be used for such purposes as well. Similarly, other electronics may be used for any of the processing functions described, such as filtering displacement currents, performing tasks to make logical determinations on data, such as referencing lookup tables, applying correction factors, etc. It will also be appreciated that such processing may be performed in a local or distributed fashion, as is known. Accordingly, such electronics and processing techniques are not discussed at length here in the interest of brevity.

Monitoring of micro sensors 210 may be performed by processor 508 on an individual or group basis. That is, processor 508 may monitor and record individual data for each micro sensor 210. Accordingly, each micro sensor 210 may be individually identifiable, e.g., by a unique sensor identification number that is associated with location or other sensor-specific data. In an embodiment, micro sensors 210 may be monitored in groups. For example, processor 508 may monitor and record bank data for a group of one or more micro sensors 210. These groups may be referred to as sensor blocks, and each sensor block may have a corresponding power source and processor. That is, the sensor blocks may function independently from each other and be monitored or controlled separately. Accordingly, the group of micro sensors 210 may be associated with location or other group-specific data that corresponds to the group of sensors as a whole.

Electronic circuitry 218 of wafer processing equipment may include a memory 512 mounted on, e.g., wafer substrate 202 or chamber wall 404. Memory 512 may include one or more of a main memory (e.g., read-only memory (ROM), flash memory, dynamic random access memory (DRAM) such as synchronous DRAM (SDRAM) or Rambus DRAM (RDRAM), etc.), a static memory (e.g., flash memory, static random access memory (SRAM), etc.), or a secondary memory (e.g., a data storage device). Processor 508 may communicate with memory 512 via bus 510 or other electrical connection. Thus, processor 508 may be operably coupled to memory 512 to record the predetermined location of the triggered micro sensor 210 and the time value output by clock 504, in the memory 512. That is, memory 512 may log a time when a particle or material is deposited on or removed from micro sensor 210, and a location where the affected micro sensor is mounted when the material alights on or from the micro sensor 210.

Electronic circuitry 218 of wafer processing tool 102 may include power source 304, as described above. Power source 304 may include a battery, a capacitor bank, or another known power supply. Power source 304 may be electrically connected to, and may power, one or more of the components of electronic circuitry 218 through bus 510, e.g., micro sensors 210, clock 504, processor 508, or memory 512.

Electronic circuitry 218 of wafer processing tool 102 may include additional components. For example, electronic circuitry 218 may include an accelerometer 514 that triggers clock 504 to begin outputting a time value when particle monitoring device 200 ceases movement, e.g., after being loaded into a particular process chamber 114 of wafer processing tool 102. Thus, the time value may provide information about when particle monitoring device 200 is loaded into a particular processing station of wafer processing tool 102. Electronic circuitry 218 may include a frequency source 516, e.g., a broad frequency source 516, or a detector 518. Frequency source 516 and detector 518 may have particular application in relation to specific embodiments of micro sensors 210 of wafer processing tool 102. For example, frequency source 516 and detector 518 may be used to drive and monitor a micro-resonator type micro sensor, as described below.

The components of electronic circuitry 218 described above are illustrative of a range of sensors that may be used, and not restrictive. For example, additional sensors, such as a temperature sensor 520, may be integrated in the fabrication of wafer processing tool 102. Temperatures sensor 520 may monitor a temperature of one or more components of wafer processing tool 102, e.g., chamber volume 406. Various embodiments of micro sensors 210 are now described. It is stated at the outset that the configurations and illustrations of micro sensors 210 are illustrative in nature, and many additional configurations may be contemplated by one skilled in the art based on this description.

Figure 6:
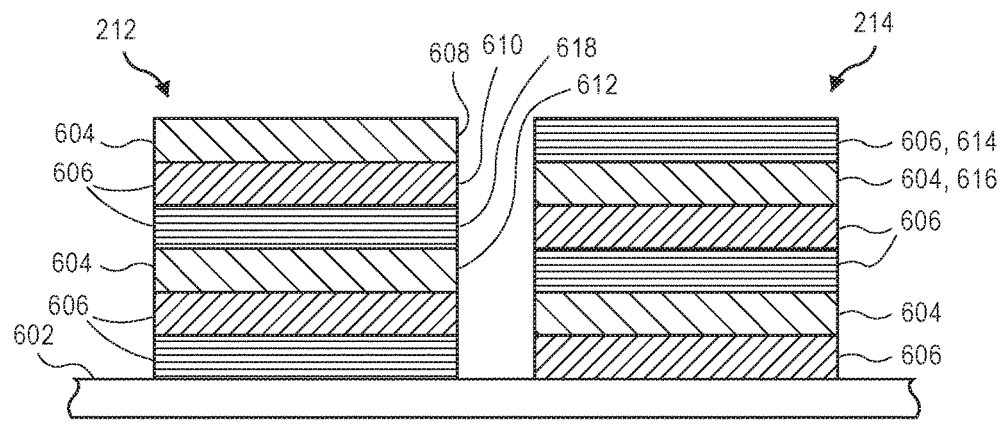
FIG. 6 is a sectional illustration of several micro sensors having laminate structures including selectively exposable sensing layers, in accordance with an embodiment.

Referring to FIG. 6, a sectional illustration of several micro sensors having laminate structures including selectively exposable sensing layers is illustrated in accordance with an embodiment. Several micro sensors 210 of the type described below, e.g., capacitive, Quartz Crystal Micro-Balance (QCM), or micro resonator sensors, may be disposed within process chamber. For example, first micro sensor 212 and second micro sensor 214 may be mounted on a mounting surface 602 of process chamber 114 or wafer substrate 202. First micro sensor 212 and second micro sensor 214 may be adjacent to one another, e.g., in a side-by-side configuration, and each micro sensor may include one or more sensing layers 604 and one or more mask layers 606. Furthermore, the sensing layers 604 of first micro sensor 212 and second micro sensor 214 may be selectively exposable, such that a sensing layer 604 of first micro sensor 212 is exposed to a surrounding environment, e.g., chamber volume 406, when a sensing layer 604 of second micro sensor 214 is masked by a mask layer 606. Likewise, a sensing layer 604 of second micro sensor 214 may be exposed to the surrounding environment when the sensing layer 604 of first micro sensor 212 is masked by a mask layer 606.

To achieve a selectively exposable sensor structure, each micro sensor may include a column of one or more laminated and alternating materials. For example, first micro sensor 212 may have an initial configuration that includes an exposed sensing layer 608 laminated over a first mask layer 610. Likewise, first mask layer 610 may be laminated over a first sensing layer 612. The exposed sensing layer 608 may be open to the surrounding environment, e.g., chamber volume, to sense and monitor a wafer fabrication process, when the first sensor layer 612 is protected by first mask layer 610.

Second micro sensor 214 may include a structure similar to first micro sensor 212. For example, second micro sensor 214 may have a second mask layer 614 over a second sensing layer 616. In the initial configuration, however, second mask layer 614 may be open to the surrounding environment such that second sensing layer 616 is protected from the wafer fabrication process that exposed sensing layer 608 of first micro sensor 212 is monitoring. As described below, when first sensing layer 612 reaches an end-of-life, second mask layer 614 may be removed to expose second sensing layer 616. Thus, the sensing capability of the wafer processing equipment may be refreshed and extended, and second sensing layer 616 may become exposed to monitor the surrounding environment during a subsequent series of wafer processing cycles.

In an embodiment, the alternating mask layers 606 of first micro sensor 212 or second micro sensor 214 may include different materials. More particularly, the materials forming the mask layers 606 may be susceptible to etching by different actions. By way of example, first mask layer 610 disposed under exposed sensing layer 608 in the initial configuration may be formed from a first mask material, and second mask layer 614, which may be exposed to the surrounding environment during the initial configuration, may be formed from a second mask material. The first mask material may be susceptible to etching by an etchant within the chamber volume and the second mask material may not be susceptible to etching by the same etchant, or vice versa. Accordingly, when second mask layer 614 is etched to expose the underlying second sensing layer 616, the utilized etchant may not remove first mask layer 610, and thus, an underlying first sensing layer 612 of first micro sensor 212 may remain intact and protected when second sensing layer 616 is monitoring the wafer fabrication process.

Sensing layers 604 within each micro sensor may be separated from each other by one or more mask layers 606. For example, exposed sensing layer 608 of first micro sensor 212 may be separated from first sensing layer 612 by first mask layer 610. That is, first of mask layer 606 may be between exposed sensing layer 608 and first sensing layer 612. Similarly, an intermediate mask layer 618 may be disposed between exposed sensing layer 608 in first sensing layer 612. For example, intermediate mask layer 618 may be below first mask layer 610, as shown, or above first mask layer 610. In other words, two sensing layers of a micro sensor may be separated by two or more mask layers of the micro sensor. Furthermore, the mask layers of a same micro sensor may include dissimilar materials. For example, intermediate mask layer 618 may be formed from a different material susceptible to etching by a different etchant than first mask layer 610. Thus, the mask layers 606 of each micro sensor may be formed from dissimilar materials, allowing them to be selectively etched by predetermined etchants to expose an underlying structure as desired.

The laminate structure shown in FIG. 6 may include sensing layers 604 that represent individual micro sensors, or portions of a micro sensor. More particularly, first micro sensor 212 may include several stacked and vertically offset capacitive micro sensors having respective first and second conductors (such conductors are described below with respect to FIG. 9). Alternatively, first micro sensor 212 may be considered to be an individual capacitive micro sensor, and thus, an elongated conductor of the capacitive micro sensor as described below may be formed to have a laminate structure that includes several vertically separated sensing layers 604 insulated from each other by intervening mask layers 606.

When the micro sensor includes a laminate structure, etching of the various layers may change a parameter of the micro sensor. For example, when the sensor itself is layered, removal of the layers may change a capacitance of the sensor. Accordingly, as the capacitance changes, the sensor may be recalibrated to adjust for the etching. That is, the sensor may be recalibrated to adjust for a new base capacitance for accurate sensing of the wafer fabrication process.

Figure 7:
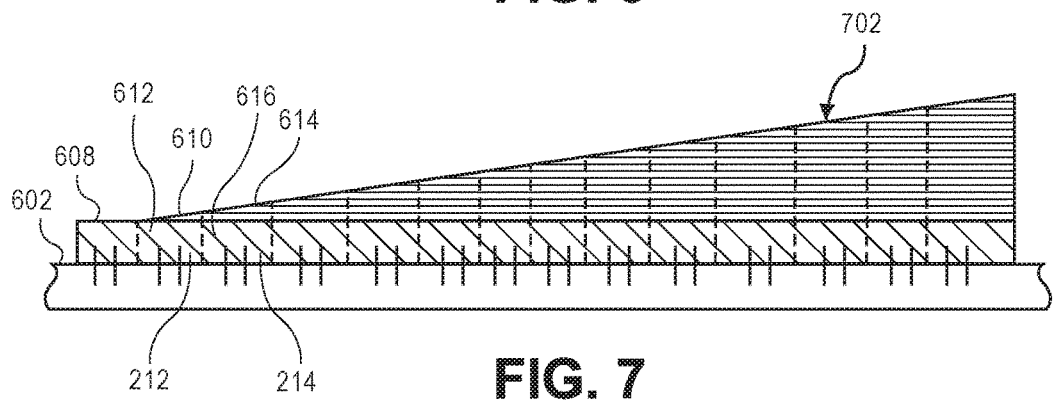
FIG. 7 is a sectional illustration of several micro sensors having a blanket mask layer over selectively exposable sensing layers, in accordance with an embodiment.

Referring to FIG. 7, a sectional illustration of several micro sensors having a blanket mask layer 702 over selectively exposable sensing layers 604 is illustrated in accordance with an embodiment. Several micro sensors may be arranged side-by-side over mounting surface 602. A leftmost micro sensor may include exposed sensing layer 608 in an initial configuration. By contrast, the other micro sensors, e.g., first micro sensor 212 and second micro sensor 214, may include respective sensing layers 604 and mask layers 606. For example, first micro sensor 212 may include first mask layer 610 over first sensing layer 612. Similarly, second micro sensor 214 may include second mask layer 614 over second sensing layer 616.

As shown, the respective mask layers 606 of each micro sensor may be a portion of a blanket mask layer 702. More particularly, a continuous mask coating may be applied over respective sensor probes to protect the covered sensing layers 604 when exposed sensing layer 608 is monitoring the surrounding environment during the initial configuration. Blanket mask layer 702 may be resistant to an etchant used during the wafer fabrication process being monitored by exposed sensing layer 608. As described below, when the exposed sensing layer 608 reaches an end-of-life, another etchant may be used, which blanket mask layer 702 is susceptible to, and the other etchant may reduce the thickness of blanket mask layer 702 such that the mask material is removed to expose adjacent micro sensors, e.g., to expose first micro sensor 212.

Blanket mask layer 702 may include a layer profile having a variable thickness such that underlying micro sensors 210 are sequentially exposed by an etchant based on a respective thickness of the portion of blanket mask layer 702 covering the micro sensor. For example, blanket mask layer 702 may have a wedge-shaped layer profile, as shown, such that first mask layer 610 over first sensing layer 612 has a first thickness and second mask layer 614 over second sensing layer 616 has a second thickness different than the first thickness. That is, the first thickness may be less than the second thickness, and thus, removal of blanket mask layer 702 at a uniform rate will expose first sensing layer 612 before second sensing layer 616. The layer profile of blanket mask layer 702 may include a profile of any variable thickness. For example, the layer profile may be stepped, parabolic, etc.

Figure 8:
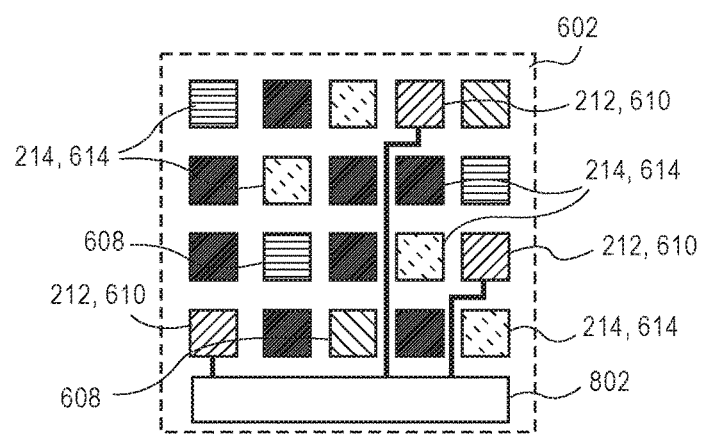
FIG. 8 is a sectional illustration of several micro sensors having mask layers of different materials over selectively exposable sensing layers, in accordance with an embodiment.

Referring to FIG. 8, a sectional illustration of several micro sensors having mask layers 606 of different materials over selectively exposable sensing layers 604 is illustrated in accordance with an embodiment. Several sets of micro sensors may be arranged on mounting surface 602. Each set of micro sensors may include respective sensing layers 604 covered by respective mask layers 606. For example, a set of first micro sensors 212 may include respective first mask layers 610 over respective first sensing layers 612 (hidden). Similarly, a set of second micro sensors 214 may include respective second mask layers 614 over respective second sensing layers 616 (hidden). At any one time during a wafer fabrication process, a set of micro sensors may include respective exposed sensing layers 608. Accordingly, exposed sensing layers 608 may monitor the wafer fabrication process, e.g., may be etched, while sensing layers 604 of other sets of micro sensors remain protected under respective mask layers 606.

The respective mask layers 606 of the various sets of micro sensors may be formed from different materials susceptible to etching by different etchants. Thus, mask layers 606 of the various sets may be selectively removed to expose the underlying sensing layers 604 when another set of exposed sensing layers 608 has been used and/or has reached an end-of-life.

In an embodiment, each set of micro sensors is electrically connected to a respective electrical bus 802. Accordingly, the sets of micro sensors may be individually sampled to detect a change in a parameter of the micro sensors, and thus, to measure and monitor the wafer fabrication process.

The sensor schemes described above may be combined into a hybrid sensor configuration. For example, multi-layered sensor structures as described with respect to FIG. 6 may include a top mask having a variable thickness such as the profile shown in blanket mask layer 702 of FIG. 7. Sensing layers 604 of a first set of micro sensors may be sequentially exposed by etching the variable thickness top mask, and then subsequent sensing layers 604 of the micro sensors may be exposed by removing intermediate mask layers 618 between vertically offset sensing layers 604 of a laminated structure.

Figure 9:
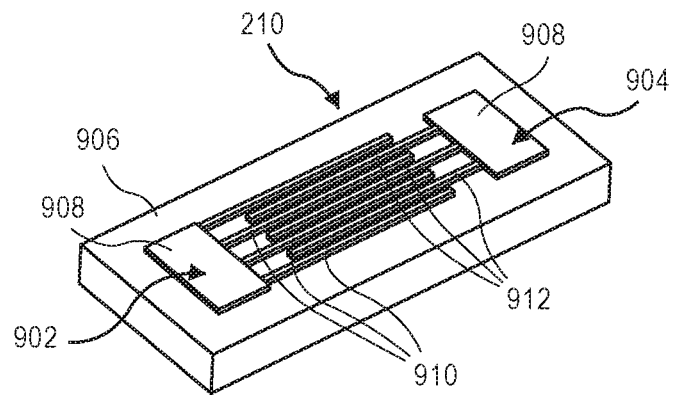
FIG. 9 is a perspective illustration of a micro sensor of a wafer processing system, in accordance with an embodiment.

Referring to FIG. 9, a perspective illustration of a micro sensor of a wafer processing system is illustrated in accordance with an embodiment. Micro sensor 210 may include a capacitive micro sensor having a capacitance, and the capacitance of micro sensor 210 may change in response to a wafer fabrication process performed by wafer processing tool 102. Micro sensor 210 may employ two or more electrodes connected to a measurement circuit. For example, micro sensor 210 may have a pair of conductors in a sensing layer that includes a first conductor 902 separated from a second conductor 904 by a dielectric gap. First conductor 902 and/or second conductor 904 may be electrically charged. For example, one or more of the electrodes may be tied directly to drive and sense signals from a measurement circuit of electronic circuitry 218. In an embodiment, one of the electrodes is connected to ground potential.

First conductor 902 and second conductor 904 may be formed from a conductive material, e.g., polysilicon, aluminum, tungsten, etc. The conductors may be formed or otherwise mounted on substrate 906. Substrate 906 may be a portion of wafer substrate 202 of particle monitoring device 200. Alternatively, substrate 906 may be mounted on wafer processing tool 102. Substrate 906 may be a silicon wafer substrate, an organic material, a blanket glass substrate, or another solid dielectric substrate, e.g., alumina, quartz, silica, etc.

Each conductor may include several fingerlike conductors extending from conductive pads 908 along respective planes. For example, first conductor 902 may include several first elongated conductors 910, and second elongated conductor 912 may include several second elongated conductors 912. In an embodiment, first elongated conductors 910 and second elongated conductors 912 are interdigitated. More particularly, the elongated conductors may be interlocked or intermeshed within a same plane to form a capacitance between the fingerlike structures. Signals may be carried in and out of the elongated conductors through conductive pads

908. Accordingly, micro sensor 210 may include a capacitor having a planar configuration.

Micro sensor 210 may be designed to maximize sensitivity. For example, the electrodes of micro sensor 210 may be formed in a small size and separated by a small space. This size scaling can achieve high sensitivity and active area density by making the sensors individually, and as a whole, sensitive to smaller particles and able to detect particles more discretely. By way of example, each elongated conductor may be separated by a dielectric gap distance of less than 3 microns. In some embodiment, the dielectric gap distance may be in a range of 50-100 nm. Accordingly, micro sensor 210 may detect small perturbations in the dielectric properties between the electrodes. The design of the monitoring and control electronic circuitry 218 may also be manipulated to modulate sensitivity. Accordingly, typical detection ranges of the micro sensors 210 may be in the low femtofarad to tens of picofarad range, and a resolution of the detection may be on the order of attofarads.

Figure 10:
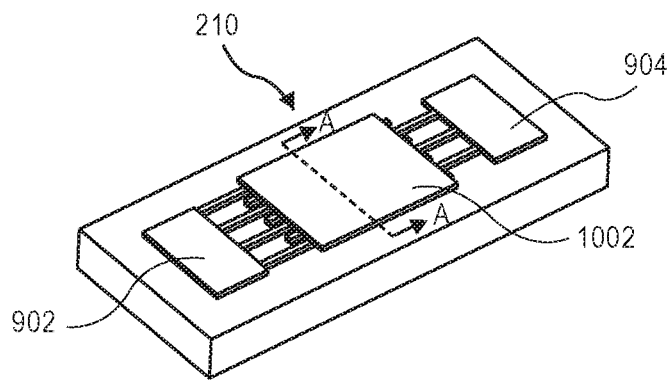
FIG. 10 is a perspective illustration of a micro sensor of a wafer processing system, in accordance with an embodiment.

Referring to FIG. 10, a perspective illustration of a micro sensor of a wafer processing system is illustrated in accordance with an embodiment. Micro sensor 210 may include a coating 1002 over one or more of first conductor 902 or second conductor 904. For example, coating 1002 may be applied over a region of the conductors that has been patterned into a planar interdigitated capacitor. Coating 1002 may be an organic or dielectric material. More particularly, coating 1002 may include a material selected to react to a wafer fabrication process. For example, coating 1002 may include a target material of an etching process. In an embodiment, coating 1002 includes a dielectric material, such as silicon oxide or silicon nitride. Accordingly, when the etch process is performed by wafer processing tool 102, an amount of coating 1002 may be removed.

In an embodiment, coating 1002 forms a portion of a mask layer of micro sensor 210 and the conductors 902, 904 form a portion of a sensing layer of micro sensor 210. The sensor layers may also be multi-layered and include intervening mask layers as described above.

Figure 11:
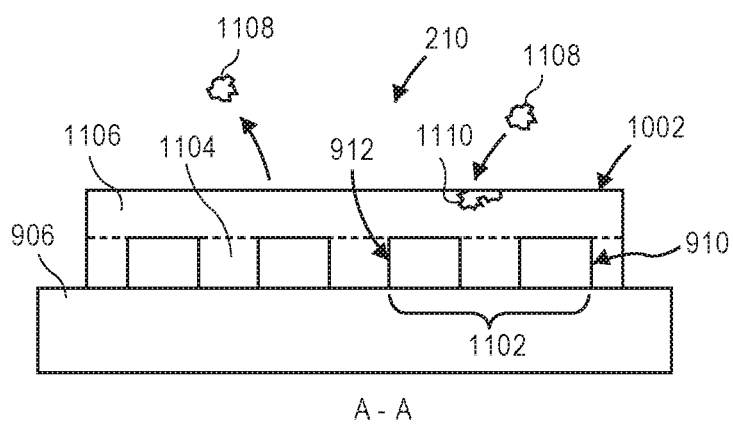
FIG. 11 is a sectional illustration, taken about line A-A of FIG. 10, of a micro sensor of a wafer processing system, in accordance with an embodiment.

Referring to FIG. 11, a sectional illustration, taken about line A-A of FIG. 10, of a micro sensor of a wafer processing system is illustrated in accordance with an embodiment. Micro sensor 210 includes a pair of conductors 1102 over substrate 906. Pair of conductors 1102 may, for example, include a first elongated conductor 910 of first conductor 902, and a second elongated conductor 912 of second conductor 904. As described above, pair of conductors 1102 may be covered at least in part by coating 1002. Coating 1002 may be a blanket coating as shown in FIG. 10. More particularly, coating 1002 may include a filler portion 1104 laterally between the interdigitated conductors, i.e., filling the dielectric gap, and an overcoat portion 1106 layered over a top surface of the conductors. Coating 1002 may have a laminated structure, e.g., filler 1104 may be a first layer formed from a first material such as a hard dielectric, e.g., oxide or nitride, and overcoat 1106 may be a second layer formed from a second material such as an organic material. It will be appreciated that either portion of coating 1002 is optional. For example, in an embodiment, coating 1002 includes filler 1104 laterally between the conductors, and coating 1002 does not include overcoat 1106 such that the top surfaces of the conductors are exposed. Alternatively, coating 1002 may include overcoat 1106 above the conductors, and coating 1002 may not include filler 1104 such that a void is present in the dielectric gap laterally between the conductors. Other embodiments of coating 1002 may be used. For example, coating 1002 may be conformal such that a thin conformal coating, e.g., 2 nanometers thick, is layered over top and lateral surfaces of the conductors and substrate 906. The elongated conductors may have a width or a height greater than the thickness of the conformal coating 1002, e.g., 3 microns, and thus, the coating 1002 may cover an entire surface of micro sensor 210, and at least a portion of the dielectric gap between pair of conductors 1102 may be unfilled.

Deposition of a material 1108 onto any portion of micro sensor 210 may result in a change in the capacitance of micro sensor 210. For example, deposition of material 1108 onto the interdigitated fingerlike structures shown in FIG. 9 or the coating 1002 shown in FIG. 10 may change the capacitance by altering the electric field between pair of conductors 1102.

In an embodiment, material 1108 deposited onto micro sensor 210 is a gas. Accordingly, micro sensor 210 may include several surface area increasing structures. For example, the surface area increasing structures may include fibers, or pores 1110, designed to entrap or absorb the gas. For example, coating 1002 may include a material, e.g., a porous oxynitride, having a predetermined porosity to absorb gas like a sponge within process chamber 114. When the gas is absorbed by pores 1110, the gas may alter the dielectric constant of coating 1002, e.g., by increasing the dielectric constant of the bulk material as compared to air-filled pores 1110, and the capacitance may change.

Removal of material from micro sensor 210 may result in a change in the capacitance of micro sensor 210. For example, removal of material 1108 from the interdigitated fingerlike structures or coating 1002 may change the capacitance by altering the electric field.

The capacitance change caused by deposition or removal of material 1108 may be sensed to determine an amount or a rate of deposition. For example, the change in capacitance can be directly correlated to an amount of material 1108 added or removed. Furthermore, given that the capacitance can be monitored in real time, the etch rate, e.g., in angstroms per minute, may be calculated. Preliminary data has indicated that changes in the capacitance of micro sensors 210 can be measured to detect the presence of particles on micro sensors 210. Additionally, several micro sensors 210 may be multiplexed to detect relatively large particles. Similarly, combining micro sensors 210 may be used to determine particle size.

Material selection of the conductors 902, 904, substrate 906, and coating 1002 may be made based on a process that micro sensor 210 is used to monitor or control. For example, one or more of the structures may be impervious to an etching process that is being monitored. For example, coating 1002 may be designed to be removed by the etching process, and substrate 906 may be designed to be impervious to the etching process. Similarly, coating 1002 may be removable by the process, and the elongated conductors may not be removable by the process.

The geometry of the structures of micro sensor 210 may also be designed to correspond to the process being monitored or controlled. For example, when the process includes material deposition, the fingerlike structures may be placed as close to one another as possible to ensure that a detectable capacitance change occurs when material 1108 is deposited onto or between the conductors. A thickness of the conductors may also be varied. For example, the interdigitated elongated conductors may be thickened to make the structure more like a parallel plate structure, as opposed to a planar structure.

Figures 12, 13, 14:
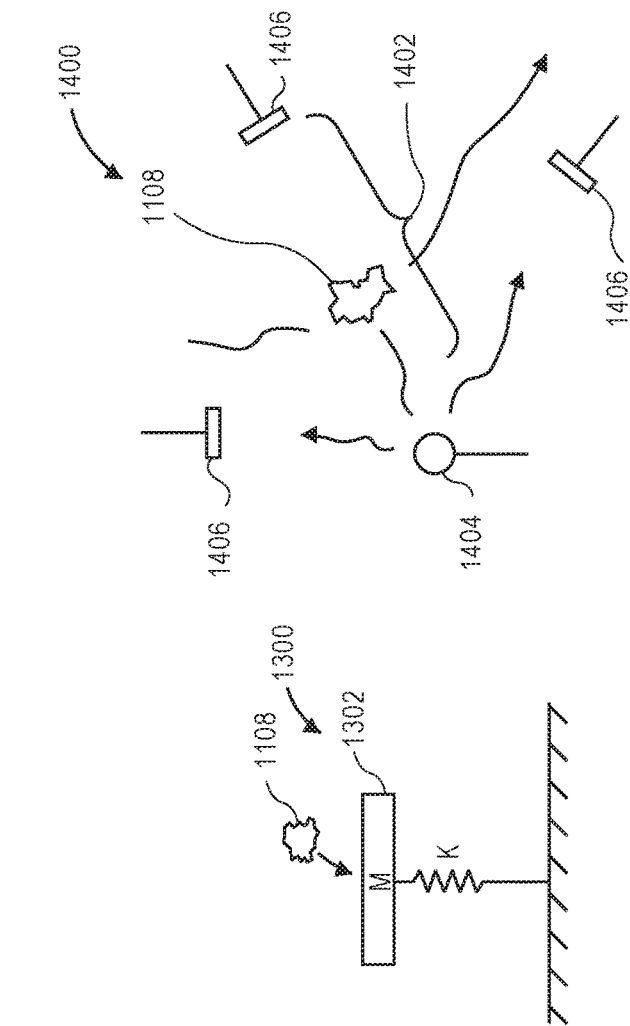
FIG. 12 is a schematic illustration of a transistor sensor type of micro sensor of a wafer processing system, in accordance with an embodiment.
FIG. 13 is a schematic illustration of a micro-resonator type of micro sensor of a wafer processing system, in accordance with an embodiment.
FIG. 14 is a schematic illustration of an optical sensor type of micro sensor of a wafer processing system, in accordance with an embodiment.

Referring to FIG. 12, a schematic illustration of a transistor sensor type of micro sensor of a wafer processing system is illustrated in accordance with an embodiment. In an embodiment, one or more micro sensors 210 of wafer processing equipment include a transistor sensor 1200. Transistor sensor 1200 may form a portion of a sensing layer of micro sensor 210. Transistor sensor 1200 may include one or more transistor, e.g., a MOSFET 1202. MOSFET 1202 may include a source 1204, a drain 1206, and a gate 1208. Transistor sensor 1200 may also include a collector 1210 to receive or emit material 1108 during a wafer fabrication process. Collector 1210 may be physically separated from MOSFET 1202, however, the subcomponents may be electrically connected with each other. For example, collector 1210 may be electrically connected to gate 1208 of MOSFET 1202 through an electrical trace 1212. Thus, MOSFET 1202 may be configured to detect that material 1108 has landed on or evaporated from collector 1210 even when collector 1210 is located at a predetermined location spaced apart from MOSFET 1202.

Collector 1210 may be sized and configured to receive material 1108. For example, a typical size of material 1108 particles may be in a range of 45 nanometers to 1 micron, and thus, collector 1210 may include an outer profile having an outer rim with a diameter of at least 1 micron. A shape of the outer rim when viewed in a downward direction may be circular, rectangular, or any other shape. Furthermore, collector 1210 may be flat, i.e., may have a planar sensor surface, or collector 1210 may have a conical sensor surface. In an embodiment, collector 1210 is not a separate structure from MOSFET 1202, but instead, is incorporated into MOSFET 1202. For example, collector 1210 may be a collection area on gate 1208 of MOSFET 1202.

Similar to micro-resonator sensor 1300 described below, collector 1210 of transistor sensor 1200 may include a sensor surface configured to simulate a surface of wafer 402. For example, transistor sensor 1200 may be located near wafer 402, e.g., on holding surface 412, and sensor surface may be oriented to face a forward direction parallel to a direction faced by a wafer surface. Collector 1210 may include a multi-layer structure, e.g., having a base layer and a top layer of a same or different material.

In an embodiment, a parameter of transistor sensor 1200 corresponds to MOSFET 1202. More particularly, the parameter of transistor sensor 1200 may be a threshold voltage of MOSFET 1202 as measured across gate 1208. The threshold voltage may correspond directly to the presence or absence of material 1108 on collector 1210. For example, the threshold voltage may have a first value when a first amount of material 1108 is on collector 1210, and the threshold voltage may have a second value (different than the first value) when a second amount of material 1108 is on collector 1210. Thus, material 1108 collected or emitted from the sensor surface of collector 1210 may be determined based on the threshold voltage of transistor sensor 1200. Processor 508 may be configured to detect a change in the threshold voltage, and thus, when a change in the threshold voltage is detected, wafer processing tool 102 can note the change as a particle detection or an amount of material 1108 deposition or removal. The threshold voltage may be logged over time to determine an actual deposition rate or removal rate of material 1108 on or from wafer 402.

Referring to FIG. 13, a schematic illustration of a micro-resonator type of micro sensor of a wafer processing system is illustrated in accordance with an embodiment. In an embodiment, one or more micro sensors of wafer processing tool 102 include a micro-resonator sensor 1300. Micro-resonator sensor 1300 may form a portion of a sensing layer of micro sensor 210. Micro-resonator sensor 1300 may be a suitable resonant mass sensor, such as a Quartz Crystal Microbalance (QCM), Surface Acoustic Wave (SAW), or Film Bulk Acoustic Resonators (FBAR), which all quantify the cumulative mass 1302 of airborne particles deposited on their surfaces. A description of the complexity and variety of micro-resonator sensors 1300 is not described here in favor of a simplified description for the purpose of brevity and ease of understanding. The micro-resonator sensor(s) 1300 may be distributed at predetermined locations on particle monitoring device 200 or wafer processing tool 102. Each micro-resonator sensor 1300 may have a characteristic frequency, e.g., a resonant frequency, as is known in the art. For example, without going into great detail, micro-resonator sensor 1300 may be represented by a simple mass-spring system. The characteristic frequency of micro-resonator sensor 1300 may be inversely proportional to a mass 1302 of the micro-resonator system. For example, the characteristic frequency may be proportional to sqrt(k/M) of the micro-resonator sensor 1300, where 'M' corresponds to mass 1302 and 'k' corresponds to a proportionality constant of the micro-resonator sensor 1300. Thus, it will be recognized that the characteristic frequency shifts when micro-resonator sensor 1300 receives or gives off material 1108, e.g., during a wafer fabrication process. For example, when material 1108, e.g., semiconductor material, is deposited on or removed from a sensor surface of micro-resonator sensor 1300 within process chamber 114 of wafer processing tool 102, mass 1302 of micro-resonator sensor 1300 changes, and accordingly, the characteristic frequency shifts.

In an embodiment, the sensor surface includes material 1108. More particularly, the sensor surface may be formed from a same semiconductor material 1108 as material 1108 deposited on or removed from wafer 402 during a wafer fabrication process. For example, when the wafer fabrication process is a deposition process to deposit silicon onto a silicon wafer 402, the sensor surface may include silicon to ensure that the deposited material 1108 interacts with sensor surface in a similar manner to the interaction with wafer 402. Similarly, when the wafer fabrication process is an etching process to remove silicon from the silicon wafer 402, the sensor surface may include silicon to ensure that material 1108 is etched from the sensor surface at a similar rate to a removal rate of silicon from the silicon wafer 402. Accordingly, the sensor surface may simulate a surface of the wafer 402 to measure an actual deposition rate or removal rate that is simultaneously occurring to the wafer 402 during the wafer fabrication process.

Referring to FIG. 14, a schematic illustration of an optical sensor type of micro sensor of a wafer processing system is illustrated in accordance with an embodiment. In an embodiment, one or more micro sensors of wafer processing tool 102 include an optical sensor 1400. Optical sensor 1400 may form a portion of a sensing layer of micro sensor 210. Optical sensor 1400 may be a Micro-Opto-Electro-Mechanical Systems (MOEMS) as is known in the art, and may be formed directly on a substrate using known semiconductor processing operations. A description of the complexity and variety of MOEMS is not described here in favor of a simplified description for the purpose of brevity and ease of understanding. Optical sensor 1400 may include several micro mirrors or lenses distributed across the sensor surface (not shown) of the substrate. Without going into great detail, optical sensor 1400 may include an optical path 1402 emanating from a light source 1404. Optical path 1402 may be between light source 1404 and a light detector 1406. In an embodiment, a parameter of optical sensor 1400 corresponds to whether light is received from light source 1404 at light detector 1406. For example, the parameter may change in response to material 1108 disturbing optical path 1402. That is, when particles of material 1108 pass through or rest in optical path 1402 and block light between light source 1404 and light detector 1406, the parameter may change. In an embodiment, when particle passes through optical sensor 1400, light from light source 1404 is reflected along a different optical path 1402 toward another light detector 1406. Detection of the reflected light by the other light detector 1406 may result in a change to the parameter of optical sensor 1400. The parameter may be, for example, an output voltage of optical sensor 1400 corresponding to light detection. Processor 508 may be configured to detect a change in the output voltage, and thus, when a change in the output voltage and/or when a disturbance in optical path 1402 is detected, wafer processing tool 102 can note the change as a deposition or removal of material 1108 from sensor surface on the substrate, and thus, deposition/removal amounts and/or rates may be measured and monitored in real-time.

It will be appreciated that, since the micro sensor types described above operate on the basis of electrical parameters that are independent of external pressures, particle monitoring device 200 or wafer processing tool 102 having one or more micro sensors 210 incorporating one or more of micro-resonator sensor 1300, transistor sensor 1200, or optical sensor 1400 may work at any pressure regime, including under vacuum conditions. Similarly, the micro sensors may operate regardless of a gaseous consistency of chamber volume 406, including under plasma-less conditions.

Particle monitoring device 200 or wafer processing tool 102 may include any combination of the sensors described above. For example, micro sensors 210 may be grouped by the thousands on an underlying substrate. More particularly, micro sensors 210 may be tied in banks so that a base capacitance may be selected by selecting a different number of capacitors from the banks. Such selection may be controlled by processor 508. In an embodiment, processor 508 monitors sensors of different types. For example, a micro sensor 210 configured to detect material deposition and a micro sensor 210 configured to detect material etching may be simultaneously monitored, or monitored during different stages of a wafer fabrication process to gather additional data and to form a multipurpose sensor. Similarly, an analog to digital capacitive measurement circuit may be used to monitor micro sensors 210 at different frequencies to garner additional information. For example, the measurement circuit may probe one or more micro sensors 210 at a low frequency, a high-frequency, or by sweeping through a wide range of frequencies, to gather additional information.

Wafer processing tool 102 having micro sensors mounted on, e.g., process chamber 114, may be used to monitor or control a wafer fabrication process. Monitoring may include refreshing or revealing sensing layers of micro sensors as active micro sensors reach an end-of-life. While not restrictive, several methods of performing such monitoring and control are described below. For brevity, operations in the methods described below may refer to monitoring of a micro sensor having a capacitance parameter, however, the methods may be adapted to incorporate other micro sensor types, such as the micro sensor types described above.

Figure 15:
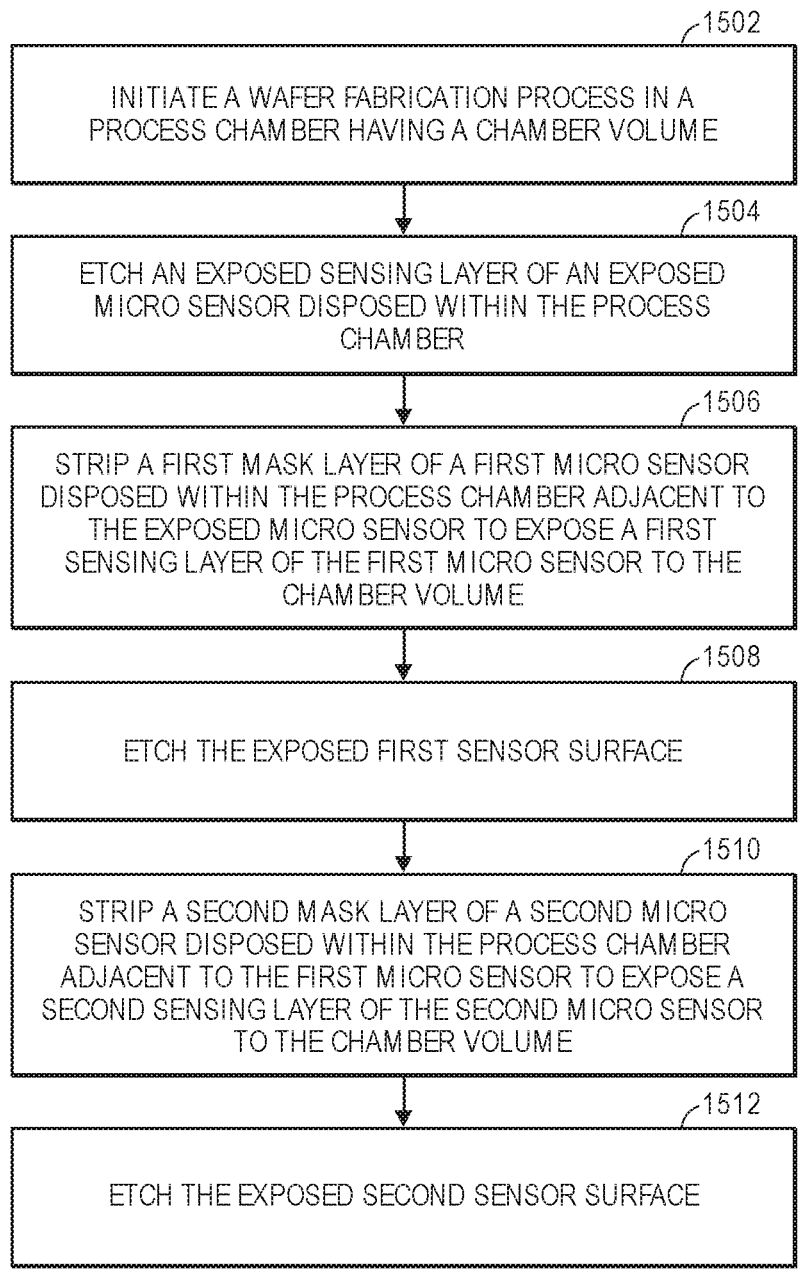
FIG. 15 is an illustration of a flowchart representing operations of a method of refreshing micro sensors of wafer processing equipment, in accordance with an embodiment.
Figure 16A:
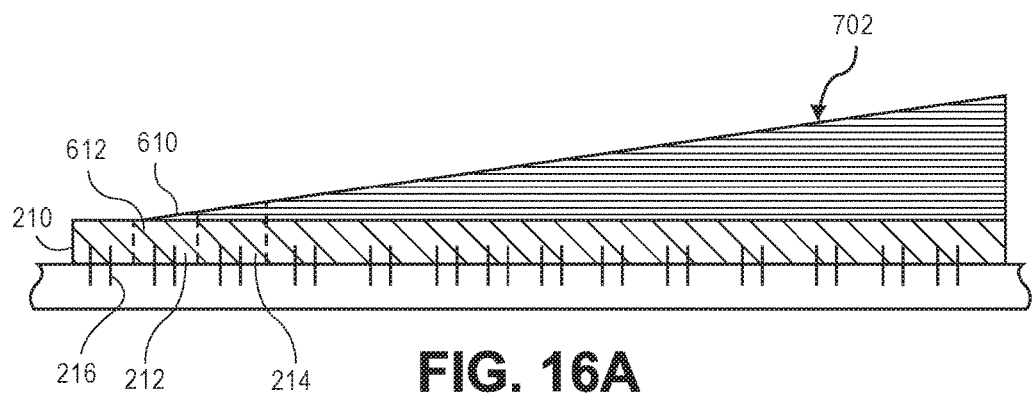
FIGS. 16A-16C are sectional illustrations showing operations of a method of refreshing micro sensors of wafer processing equipment, in accordance with an embodiment.
Figure 16B:
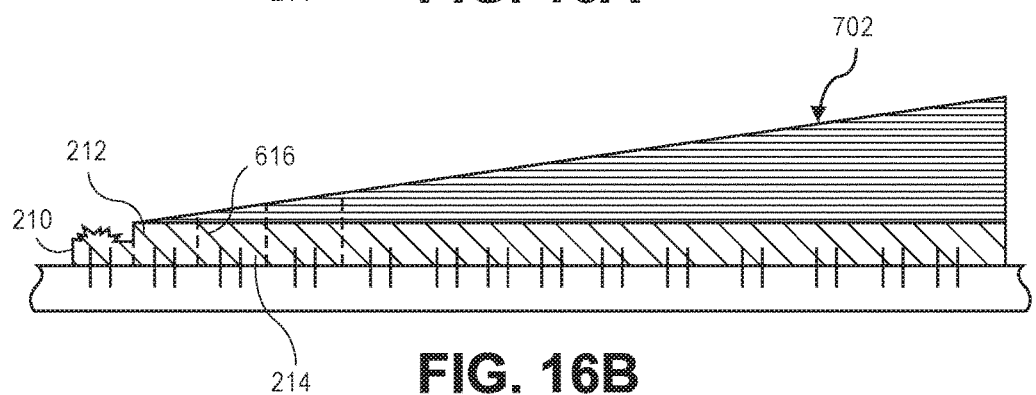
Figure 16C:
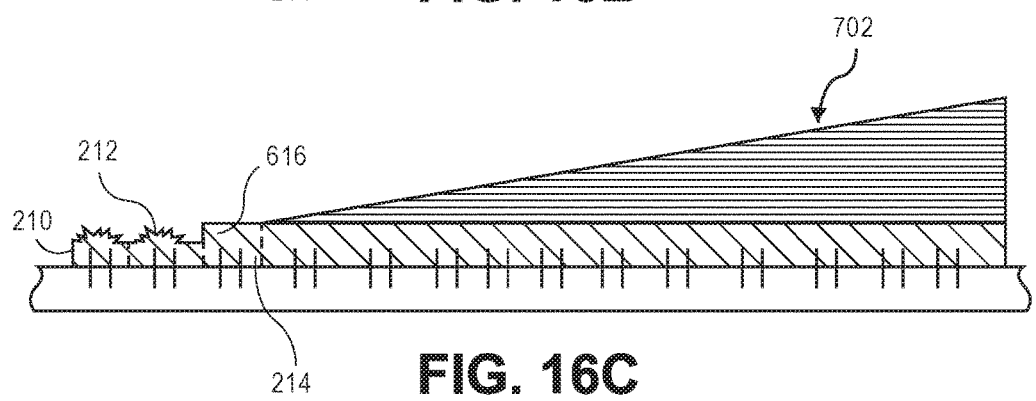

Referring to FIG. 15, an illustration of a flowchart representing operations of a method of refreshing micro sensors of wafer processing equipment is illustrated in accordance with an embodiment. FIGS. 16A-16C illustrate operations of the method described in FIG. 15, and thus, FIGS. 15 and 16A-16C are described together below.

Wafer processing equipment may include selectively exposable micro sensors as described above with respect to FIG. 7. At operation 1502, a wafer fabrication process may be initiated in process chamber 114. Referring to FIG. 16A, a wafer 402 may be loaded into the chamber volume having several micro sensors 210 and an etching process may be initiated. As shown in FIG. 16A, a leftmost micro sensor 210 may be exposed in an initial configuration. That is, when the wafer fabrication process is begun, a leftmost micro sensor 210 may be exposed to the chamber volume 406.

At operation 1504, the wafer fabrication process may include etching to remove material from the wafer 402. The leftmost micro sensor 210 may be an exposed micro sensor having a sensing layer that includes a material similar to the wafer. Thus, an exposed sensor surface on the exposed sensing layer of the exposed micro sensor may be etched by an etchant of the wafer fabrication process. Accordingly, the exposed micro sensor may sense and monitor material removal during the wafer fabrication process.

First micro sensor 212, which may be adjacent to the exposed micro sensor, may include first mask layer 610 exposed to the chamber volume 406. First mask layer 610 may be impervious to the etchant used during the wafer fabrication process. Accordingly, first sensing layer 612 beneath first mask layer 610 may be protected from the etching process during a phase of the wafer fabrication process.

The exposed micro sensor may be etched until the sensor reaches an end-of-life. The exposed micro sensor may be monitored to determine when a surface morphology of the exposed sensing surface has changed in such a way that sensitivity of the sensor is out of an allowable range, indicating the end-of-life. Testing the exposed micro sensor for the end-of-life may include an electrical diagnostic procedure. For example, an electrical input may be delivered to the exposed micro sensor through a corresponding electrical trace 216, and an output from the exposed micro sensor may be measured. The output of the exposed micro sensor may be in response to the input signal, and may correspond to a parameter of the micro sensor. For example, the output may correspond to a sensitivity of the exposed micro sensor. In such case, the sensitivity may vary based on the surface morphology, and thus, when the output is a predetermined value, it may be determined that the exposed micro sensor is at an end-of-life. In an embodiment, the exposed micro sensor may be at an end-of-life when a parameter of the micro sensor behaves in a predetermined manner. For example, when the exposed micro sensor is a capacitive micro sensor, the exposed micro sensor may be at an end-of-life when a capacitance of the micro sensor no longer changes linearly with respect to the wafer fabrication process.

When the exposed micro sensor needs to be decommissioned for replacement, another micro sensor may be selectively exposed. At operation 1506, first mask layer 610 of first micro sensor 212 shown adjacent to the exposed micro sensor may be stripped to expose a first sensor surface on first sensing layer 612 of first micro sensor 212. Stripping of first mask layer 610 may be performed using various techniques. For example, the mask layer may be stripped by a chemistry that attacks first mask layer 610. A recipe of the chemistry may depend on the mask material. For example, blanket mask layer 702 containing first mask layer 610 may include an oxide or a nitride, and the stripping chemistry may be formulated appropriately to remove the oxide are nitride material.

In an embodiment, blanket mask layer 702 is formed from a different material than the wafer fabrication process is designed to remove. For example, the wafer fabrication process may be designed to remove an oxide material, and thus, blanket mask layer 702 may be formed from a protective nitride layer. Thus, the targeted material of the wafer fabrication process may be impervious to the etchant used to strip first mask layer 610.

A mask layer covering the sensor surface may be stripped using alternative techniques. For example, the mask layer may be stripped using a thermal technique, i.e., an elevated temperature, that causes the mask layer to disintegrate and/or dissolve. In an embodiment, the mask layer may be disintegrated and/or dissolved using other agents. For example, water may be applied to the mask layer 702 to dissolve and strip the mask layer 702 such that an underlying sensing layer becomes exposed.

As shown in FIG. 16B, blanket mask layer 702 may recede to expose first micro sensor 212 to the right of the decommissioned leftmost micro sensor 210. In an embodiment, the leftmost micro sensor 210 may be removed from service by discontinuing any electrical sampling of the sensor, i.e., by electrically disconnecting the sensor. A removal rate of blanket mask layer 702 may vary for different reasons, e.g., variations in etching process, and thus, detecting when blanket mask layer 702 has receded far enough to expose first micro sensor 212, but not far enough to expose second sensing layer 616 of second micro sensor 214, may provide useful information. To this end, first micro sensor 212 and second micro sensor 214 may be simultaneously monitored during stripping of mask layer. For example, a parameter, e.g., a capacitance, of the micro sensors may be sensed. The capacitance may vary based on a thickness and/or presence of a mask layer over a sensing layer of the micro sensors, and thus, it may be determined when the mask layer is removed from first sensing layer 612 and is still present over second sensing layer 616. This diagnosis may be used to trigger a next operation in the wafer fabrication process, e.g., continuance of a wafer etching process.

At operation 1508, the exposed sensor surface on the exposed first sensing layer 612 may be etched during the wafer fabrication process. That is, the wafer fabrication process may including etching of the wafer, and the first micro sensor 212 may be active to sense the process. This may continue until first micro sensor 212 reaches an end-of-life, which may be determined as discussed above.

At operation 1510, second mask layer 614 of second micro sensor 214 may be stripped to expose a second sensor surface on second sensing layer 616. The selective exposure of second sensor surface may be performed using any of the stripping techniques described above. Accordingly, second micro sensor 214, which was protected during a previous segment of the wafer fabrication process, may be exposed to become an active sensor during a subsequent segment of the wafer fabrication process. First micro sensor 212, which may be at an end-of-life, may be decommissioned during the subsequent segment.

At operation 1512, the exposed sensor surface on the exposed second sensing layer 616 may be etched during the wafer fabrication process. That is, the wafer fabrication process may including etching of the wafer, and the second micro sensor 214 may be active to sense the process. This may continue until second micro sensor 214 reaches an end-of-life, which may be determined as discussed above. The procedure described above may be repeated to expose additional micro sensors to continuously sense the wafer fabrication process for an extended period, e.g., hundreds of process cycles.

Figure 17:
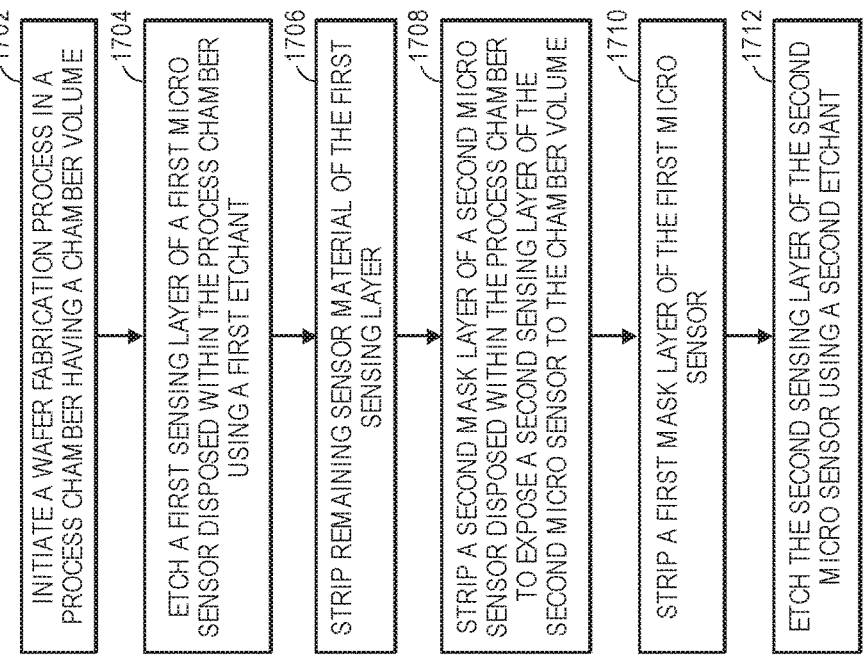
FIG. 17 is an illustration of a flowchart representing operations of a method of refreshing micro sensors of wafer processing equipment, in accordance with an embodiment.

Referring to FIG. 17, an illustration of a flowchart representing operations of a method of refreshing micro sensors of wafer processing equipment is illustrated in accordance with an embodiment. FIGS. 18A-18F illustrate operations of the method described in FIG. 17, and thus, FIGS. 17 and 18A-18F are described together below.

Figure 18A:
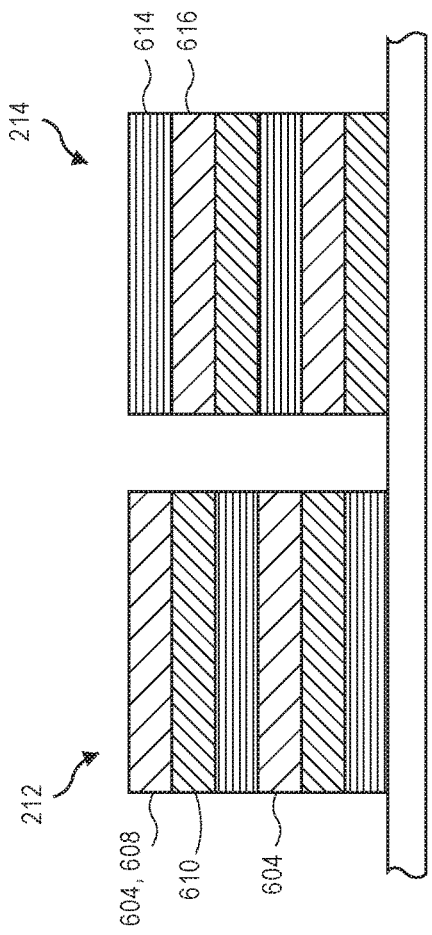
FIG. 18A-18F are sectional illustrations showing operations of a method of refreshing micro sensors of wafer processing equipment, in accordance with an embodiment.
Figure 18B:
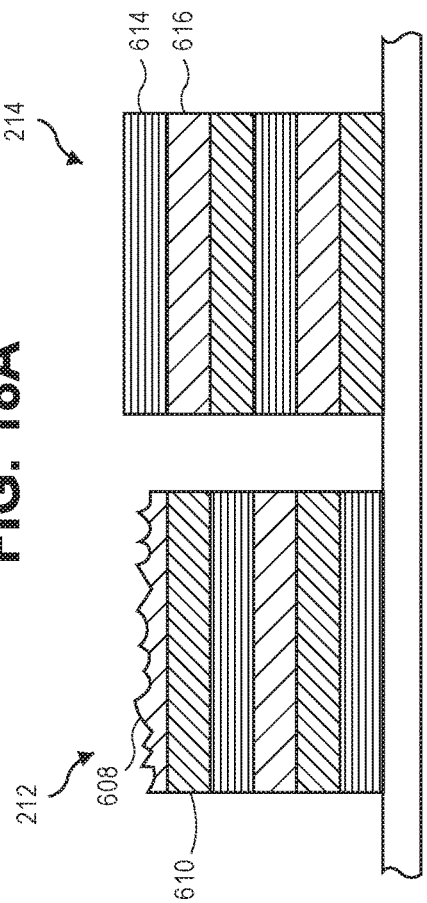

Wafer processing equipment may include several selectively exposable micro sensors as described above with respect to FIG. 6. At operation 1702, a wafer fabrication process may be initiated in process chamber. Referring to FIG. 18A, first micro sensor 212 may include an exposed sensing layer in an initial configuration. In the initial configuration, second micro sensor 214 may include a second mask layer 614 protecting an underlying second sensing layer 616. More particularly, second sensing layer 616 may be protected by second mask layer 614 when a wafer in process chamber is being processed.

At operation 1704, the wafer fabrication process may include etching to remove material from the wafer. The exposed sensing layer of first micro sensor 212 may include a material similar to the wafer. Thus, an exposed sensor surface on the exposed sensing layer may be etched by an etchant of the wafer fabrication process. Accordingly, the exposed sensing layer of first micro sensor 212 may sense and monitor material removal. The etchant used to remove material from the first sensor surface may, however, not remove material from the second mask layer 614. That is, second micro sensor 214, which may be adjacent to first micro sensor 212, may include second mask layer 614 exposed to the chamber volume. Second mask layer 614 may be formed from a material that is dissimilar to the exposed sensing layer, and thus, second sensing layer 616 beneath second mask layer 614 may be protected from the etching process during a phase of the wafer fabrication process.

The exposed sensing layer of first micro sensor 212 may be etched until the sensor reaches an end-of-life. When the first micro sensor 212 needs to be refreshed, second sensing layer 616 of second micro sensor 214 may be selectively exposed.

Figure 18C:
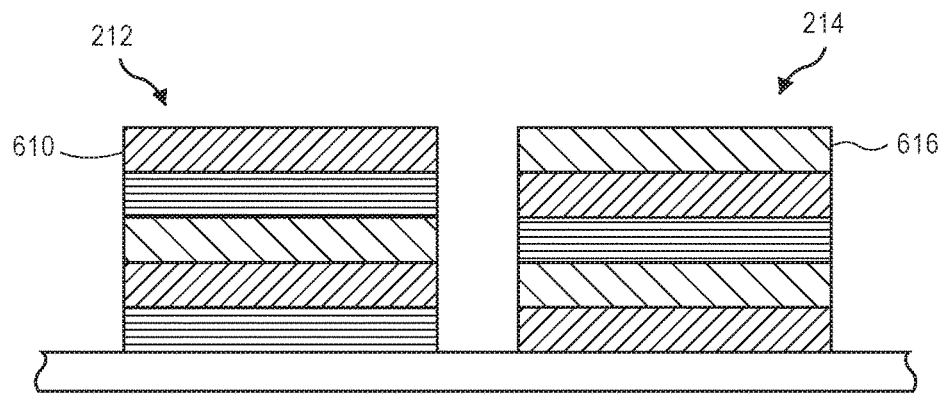

Referring to FIG. 18C, at operation 1706, before or after exposing second sensing layer 616, any remaining sensor material of first sensing layer 612 may be stripped. For example, any of the stripping techniques described above may be used to remove the remaining first sensing layer 612.

At operation 1708, second sensing layer 616 may be exposed by stripping second mask layer 614. Any of the stripping techniques described above may be used to remove second mask layer 614. Second mask layer 614 may be impervious to the etchant used to process the wafer, and second mask layer 614 may be susceptible to etching by another etchant that does not attack the wafer. Thus, second mask layer 614 may be stripped without affecting the wafer or first mask layer 610 that is exposed to chamber volume after removal of the exposed sensing layer 608. More particularly, second mask layer 614 may be formed from a different material than first mask layer 610, and thus, application of an etchant may remove one mask layer but not the other.

Figure 18D:
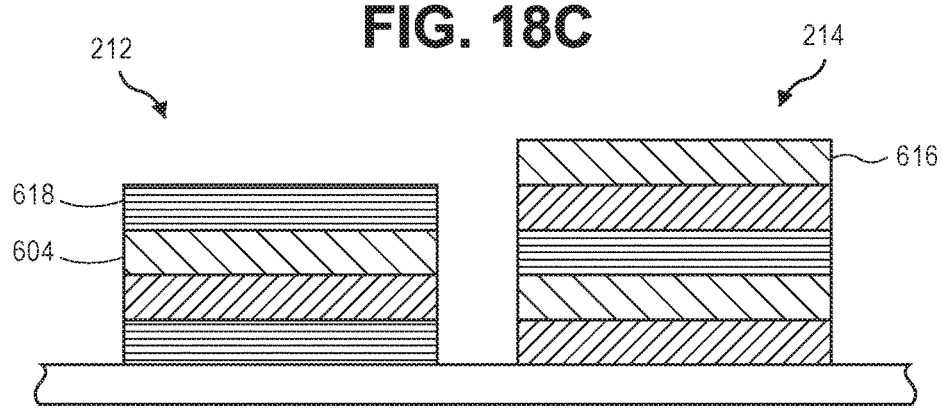

Referring to FIG. 18D, at operation 1710, after removing second mask layer 614 to expose second sensing layer 616, first mask layer 610 of first micro sensor 212 may be stripped to expose intermediate mask layer 618. Intermediate mask layer 618 may be formed over an underlying sensing layer 604 of first micro sensor 212. More particularly, intermediate mask layer 618 may be formed from a material that is impervious to etching by the etchant used to process the wafer. For example, intermediate mask layer 618 may have a same material as second mask layer 614 that protected second sensing layer 616 during an earlier phase of the wafer fabrication process. Accordingly, intermediate mask layer 618 will not be attacked by the etchant when second sensing layer 616 is monitoring the process.

Figure 18E:
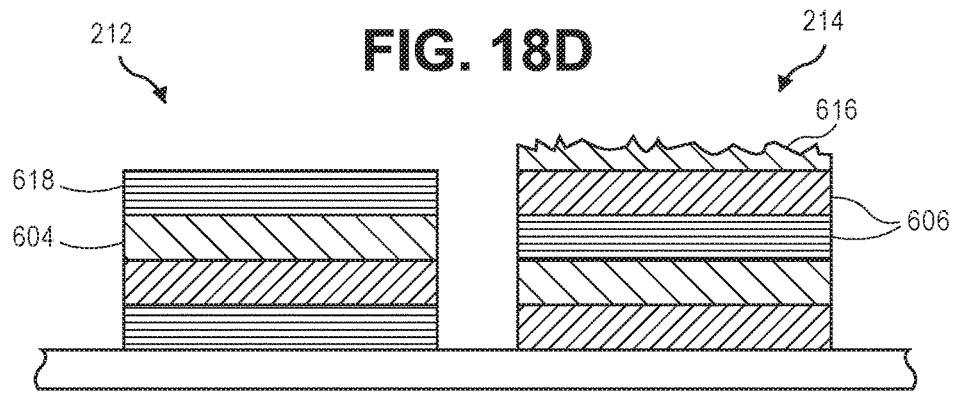

Referring to FIG. 18E, at operation 1712, the exposed sensing layer of second micro sensor 214 may be used to sense and monitor the wafer fabrication process. For example, second sensing layer 616 may monitor material removal from the wafer. Simultaneously, intermediate mask layer 618 may protect an underlying sensing layer of first micro sensor 212. The exposed sensing layer of second micro sensor 214 may be etched until the sensor reaches an end-of-life.

Figure 18F:
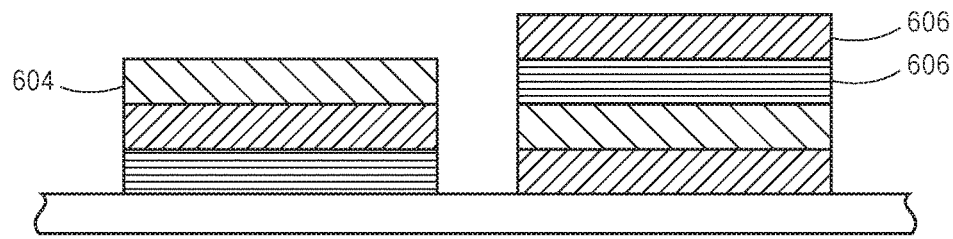

Referring to FIG. 18F, when the second micro sensor 214 needs to be replaced, first micro sensor 212 may be refreshed by exposing another sensing layer 604. More particularly, second sensing layer 616 and intermediate mask layer 618 may be stripped from their respective micro sensors to expose an underlying sensing layer 604 of first micro sensor 212 and to expose a mask layer 606 of second micro sensor 214. Accordingly, the laminated structures of first micro sensor 212 and second micro sensor 214 may be sequentially etched to intermittently expose sensing layers, which refreshes the sensing capability of the micro sensors and of the wafer fabrication equipment.

Figure 19:
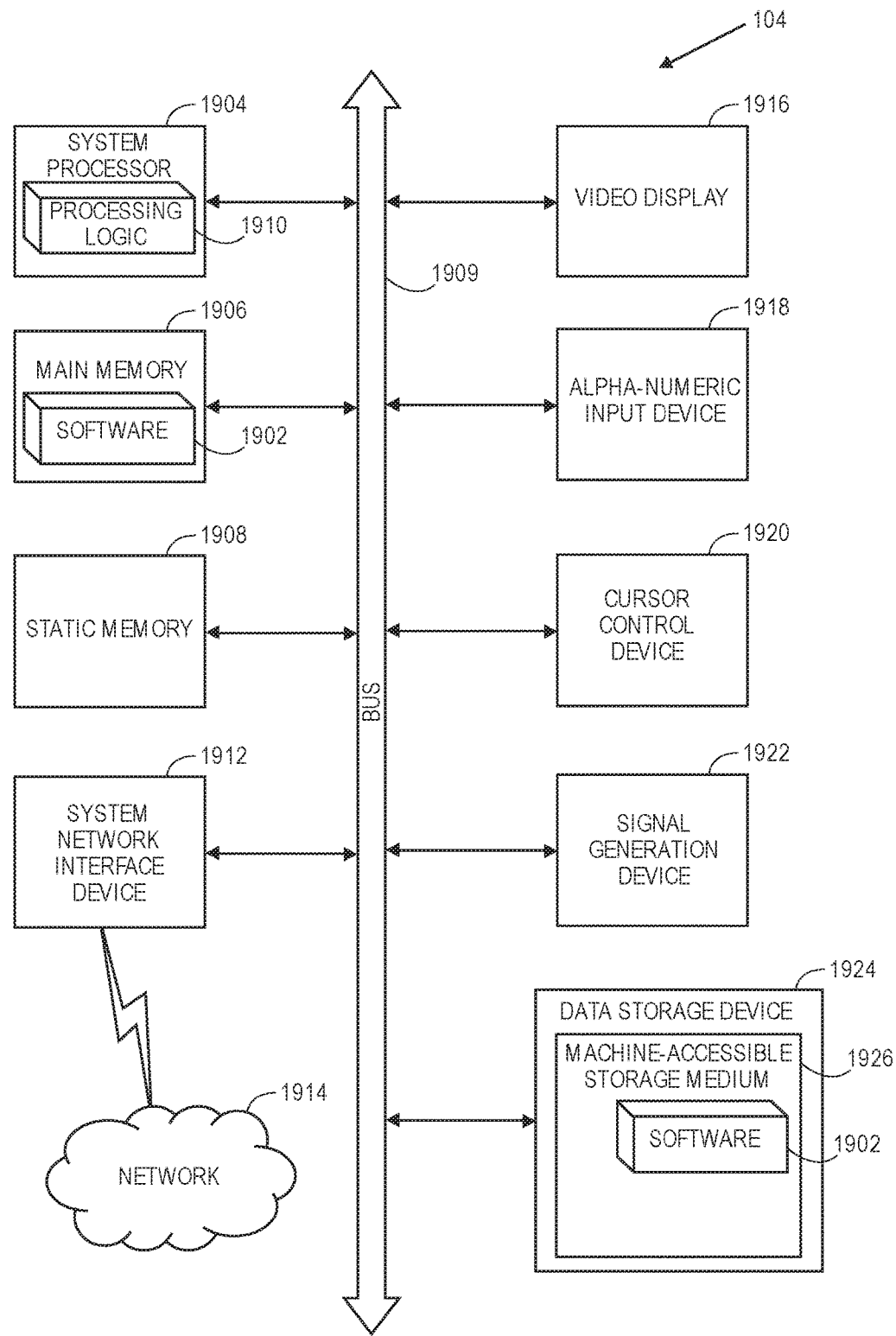
FIG. 19 illustrates a block diagram of an exemplary computer system of a wafer processing system, in accordance with an embodiment.

Referring to FIG. 19, a block diagram of an exemplary computer system of a wafer processing system is illustrated in accordance with an embodiment. One or more components of the illustrated computer system 104 may be used in electronic circuitry 218 of wafer processing tool 102. Accordingly, electronic circuitry 218 discussed above with respect to FIG. 5 may be a subset of computer system 104. Alternatively, electronic circuitry 218 may be local to particle monitoring device 200 or wafer processing tool 102 and computer system 104 may be a fabrication facility host computer that is interfaced with electronic circuitry 218 and/or a computer of wafer processing tool 102. In an embodiment, computer system 104 is coupled to and controls robots, load locks 112, process chambers 114, and other components of wafer processing tool 102. Computer system 104 may also receive and analyze particle detection or material deposition/removal information provided by micro sensors 210 as described above.

Computer system 104 may be connected (e.g., networked) to other machines in a Local Area Network (LAN), an intranet, an extranet, or the Internet. Computer system 104 may operate in the capacity of a server or a client machine in a client-server network environment, or as a peer machine in a peer-to-peer (or distributed) network environment. Computer system 104 may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated for computer system 104, the term "machine" shall also be taken to include any collection of machines (e.g., computers) that individually or jointly execute a set (or multiple sets) of instructions to perform any one or more of the methodologies described herein.

Computer system 104 may include a computer program product, or software 1902, having a non-transitory machine-readable medium having stored thereon instructions, which may be used to program computer system 104 (or other electronic devices) to perform a process according to embodiments. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., infrared signals, digital signals, etc.)), etc.

In an embodiment, computer system 104 includes a system processor 1904, a main memory 1906 (e.g., read-only memory (ROM), flash memory, dynamic random access memory (DRAM) such as synchronous DRAM (SDRAM) or Rambus DRAM (RDRAM), etc.), a static memory 1908 (e.g., flash memory, static random access memory (SRAM), etc.), and a secondary memory (e.g., a data storage device 1924), which communicate with each other via a bus 1909.

System processor 1904 represents one or more general-purpose processing devices such as a microsystem processor, central processing unit, or the like. More particularly, the system processor 1904 may be a complex instruction set computing (CISC) microsystem processor, reduced instruction set computing (RISC) microsystem processor, very long instruction word (VLIW) microsystem processor, a system processor implementing other instruction sets, or system processors implementing a combination of instruction sets. System processor 1904 may also be one or more special-purpose processing devices such as an application specific integrated circuit (ASIC), a field programmable gate array (FPGA), a digital signal system processor (DSP), network system processor, or the like. System processor 1904 is configured to execute the processing logic 1910 for performing the operations described herein.

The computer system 104 may further include a system network interface device 1912 for communicating with other devices or machines, e.g., wafer processing tool 102, over a network 1914. The computer system 104 may also include a video display unit 1916 (e.g., a liquid crystal display (LCD), a light emitting diode display (LED), or a cathode ray tube (CRT)), an alphanumeric input device 1918 (e.g., a keyboard), a cursor control device 1920 (e.g., a mouse), and a signal generation device 1922 (e.g., a speaker).

The secondary memory may include a data storage device 1924 having a machine-accessible storage medium 1926 (or more specifically a computer-readable storage medium) on which is stored one or more sets of instructions (e.g., software 1902) embodying any one or more of the methodologies or functions described herein. The software 1902 may also reside, completely or at least partially, within the main memory 1906 and/or within the system processor 1904 during execution thereof by the computer system 104, the main memory 1906 and the system processor 1904 also constituting machine-readable storage media. The software 1902 may further be transmitted or received over a network 1914 via the system network interface device 1912.

While the machine-accessible storage medium 1926 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies. The term "machine-readable storage medium" shall accordingly be taken to include, but not be limited to, solid-state memories, and optical and magnetic media.

In the foregoing specification, specific exemplary embodiments have been described. It will be evident that various modifications may be made thereto without departing from the scope of the following claims. The specification and drawings are, accordingly, to be regarded in an illustrative sense rather than a restrictive sense.

What is claimed is:

1. A wafer processing tool, comprising:
   a process chamber having a chamber volume;
   a first micro sensor mounted within the chamber volume, wherein the first micro sensor includes a first mask layer over a first sensing layer; and
   a second micro sensor mounted within the chamber volume, wherein the second micro sensor includes a second mask layer over a second sensing layer;
   wherein the first micro sensor and the second micro sensor have respective parameters and include respective sensor surfaces on the respective sensing layers, and wherein the respective parameters change when material is removed from the respective sensor surfaces.

2. The wafer processing tool of claim 1, further comprising an exposed sensing layer mounted within the chamber volume and open to the chamber volume.

3. The wafer processing tool of claim 2, wherein the first mask layer has a first thickness and the second mask layer has a second thickness different than the first thickness.

4. The wafer processing tool of claim 3, wherein the first mask layer and the second mask layer are portions of a blanket mask layer having a layer profile including a variable thickness.

5. The wafer processing tool of claim 2, wherein the first mask layer has a first mask material, wherein the second mask layer has a second mask material, and wherein the first mask material is susceptible to etching by an etchant within the chamber volume and the second mask material is not susceptible to etching by the etchant.

6. The wafer processing tool of claim 5, wherein the first micro sensor includes the exposed sensing layer, and wherein the first mask layer is between the exposed sensing layer and the first sensing layer.

7. The wafer processing tool of claim 6 further comprising an intermediate mask layer between the exposed sensing layer and the first sensing layer.

8. The wafer processing tool of claim 1, wherein the micro sensors include micro sensors, wherein the respective parameters are capacitances of the micro sensors, and wherein the capacitances change when a material is removed from the respective sensor surfaces.

9. A particle monitoring device, comprising:
   a wafer substrate including wafer electronics and a support surface;
   a first micro sensor mounted on the support surface, wherein the first micro sensor includes a first mask layer over a first sensing layer; and
   a second micro sensor mounted on the support surface, wherein the second micro sensor includes a second mask layer over a second sensing layer;
   wherein the first micro sensor and the second micro sensor have respective parameters and include respective sensor surfaces on the respective sensing layers, and wherein the respective parameters change when material is removed from the respective sensor surfaces.

10. The particle monitoring device of claim 9, further comprising an exposed sensing layer mounted on the support surface and open to a surrounding environment.

11. The particle monitoring device of claim 10, wherein the first mask layer has a first thickness and the second mask layer has a second thickness different than the first thickness.

12. The particle monitoring device of claim 11, wherein the first mask layer and the second mask layer are portions of a blanket mask layer having a layer profile including a variable thickness.

13. The particle monitoring device of claim 10, wherein the first mask layer has a first mask material, wherein the second mask layer has a second mask material, and wherein the first mask material is susceptible to etching by an etchant within the surrounding environment and the second mask material is not susceptible to etching by the etchant.

14. The particle monitoring device of claim 13, wherein the first micro sensor includes the exposed sensing layer, and wherein the first mask layer is between the exposed sensing layer and the first sensing layer.

15. The particle monitoring device of claim 14 further comprising an intermediate mask layer between the exposed sensing layer and the first sensing layer.

16. The particle monitoring device of claim 9, wherein the micro sensors include micro sensors, wherein the respective parameters are capacitances of the micro sensors, and wherein the capacitances change when material is removed from the respective sensor surfaces.

17. A method, comprising:
    initiating a wafer fabrication process in a process chamber having a chamber volume, wherein a first micro sensor and a second micro sensor are disposed within the process chamber, and wherein a first sensing layer of the first micro sensor and a second mask layer of the second micro sensor are exposed to the chamber volume;
    etching a first sensor surface on the first sensing layer of the first micro sensor by an etchant; and
    stripping the second mask layer of the second micro sensor to expose a second sensor surface on a second sensing layer of the second micro sensor to the chamber volume.

18. The method of claim 17, wherein the micro sensors include micro sensors having respective capacitances, and wherein the respective capacitances change when material is removed from the respective sensor surfaces.

19. The method of claim 18 further comprising:
    measuring the respective capacitances; and
    determining, based on the respective capacitances, whether the second sensor surface on the second sensing layer is exposed to the chamber volume.

20. The method of claim 18, wherein the etchant removes material from the first sensor surface and does not remove material from the second mask layer.

* * * * *